US011912918B2

(12) United States Patent
Meyer et al.

(10) Patent No.: US 11,912,918 B2
(45) Date of Patent: *Feb. 27, 2024

(54) PHOSPHOR PARTICLE COATING

(71) Applicant: Lumileds LLC, San Jose, CA (US)

(72) Inventors: Jens Meyer, Cologne (DE); Andreas Tücks, Aachen (DE); Peter Josef Schmidt, Aachen (DE); Erik Roeling, Son (NL)

(73) Assignee: LUMILEDS LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/925,940

(22) PCT Filed: Jun. 29, 2021

(86) PCT No.: PCT/US2021/039514
§ 371 (c)(1),
(2) Date: Nov. 17, 2022

(87) PCT Pub. No.: WO2022/006048
PCT Pub. Date: Jan. 6, 2022

(65) Prior Publication Data
US 2023/0193125 A1   Jun. 22, 2023

Related U.S. Application Data

(63) Continuation-in-part of application No. 16/915,422, filed on Jun. 29, 2020.

(30) Foreign Application Priority Data

Aug. 5, 2020 (EP) ..................................... 20189538

(51) Int. Cl.
C09K 11/77 (2006.01)
C09K 11/02 (2006.01)
(Continued)

(52) U.S. Cl.
CPC .......... *C09K 11/7703* (2013.01); *C09K 11/02* (2013.01); *C09K 11/77346* (2021.01);
(Continued)

(58) Field of Classification Search
CPC ................ C09K 11/02; C09K 11/7703; C09K 11/77346; C23C 16/40; C23C 16/403;
(Continued)

(56) References Cited

U.S. PATENT DOCUMENTS 7,341,676 B2   3/2008 Okada et al.
8,038,905 B2   10/2011 Mueller-Mach et al.
(Continued)

FOREIGN PATENT DOCUMENTS

JP   2006-274265 A   10/2006
WO   2005/087894 A1   9/2005
(Continued)

OTHER PUBLICATIONS

From the EPO as the ISA, "Notification of Transmittal of the International Search Report and the Written Opinion of the International Searching Authority or the Declaration", PCT/US2021/039514, dated Sep. 16, 2021, 13 pages.
(Continued)

*Primary Examiner* — C Melissa Koslow

(57) ABSTRACT

The invention provides a method for providing a luminescent particle (100) with a hybrid coating, the method comprising: (i) providing a luminescent core (102) comprising a primer layer (105) on the luminescent core (102); (ii) providing a main ALD coating layer (120) onto the primer layer (105) by application of a main atomic layer deposition process, the main ALD coating layer (120) comprising a multilayer (1120) with two or more layers (1121) having different chemical compositions, and wherein in the main atomic layer deposition process a metal oxide precursor is
(Continued)

selected from a group of metal oxide precursors comprising Al, Zn, Hf, Ta, Zr, Ti, Sn, Nb, Y, Ga, and V; (iii) providing a main sol-gel coating layer (130) onto the main ALD-coating layer (120) by application of a main sol-gel coating process, the main sol-gel coating layer (130) having a chemical composition different from one or more of the layers (1121) of the multilayer (1120).

19 Claims, 9 Drawing Sheets

(51) Int. Cl.
| | | |
|---|---|---|
| C23C 18/12 | (2006.01) | |
| C23C 16/455 | (2006.01) | |
| C23C 16/40 | (2006.01) | |
| H01L 33/50 | (2010.01) | |
| F21V 9/30 | (2018.01) | |

(52) U.S. Cl.
CPC ............ *C23C 16/40* (2013.01); *C23C 16/403* (2013.01); *C23C 16/405* (2013.01); *C23C 16/407* (2013.01); *C23C 16/45529* (2013.01); *C23C 16/45553* (2013.01); *C23C 18/1254* (2013.01); *F21V 9/30* (2018.02); *H01L 33/502* (2013.01)

(58) Field of Classification Search
CPC ............... C23C 16/405; C23C 16/407; C23C 16/45529; C23C 16/4553; C23C 18/1254; H01L 33/502
See application file for complete search history.

(56) References Cited

U.S. PATENT DOCUMENTS

| | | | |
|---|---|---|---|
| 2005/0179041 A1* | 8/2005 | Harbers | H04N 9/315 |
| | | | 257/432 |
| 2006/0198137 A1* | 9/2006 | Lee | H05B 45/00 |
| | | | 362/249.02 |
| 2008/0143970 A1* | 6/2008 | Harbers | H04N 9/3155 |
| | | | 353/31 |
| 2014/0264196 A1 | 9/2014 | Werner et al. | |
| 2015/0362150 A1* | 12/2015 | Van Bommel | C23C 16/403 |
| | | | 252/301.36 |
| 2018/0122993 A1 | 5/2018 | Camras et al. | |

FOREIGN PATENT DOCUMENTS

| | | |
|---|---|---|
| WO | 2013/070902 A1 | 5/2013 |
| WO | 2014/128676 A1 | 8/2014 |
| WO | 2015/062697 A1 | 5/2015 |
| WO | 2016/041838 A1 | 3/2016 |
| WO | 2016/046216 A1 | 3/2016 |
| WO | 2017/036997 A1 | 3/2017 |

OTHER PUBLICATIONS

The extended European search report corresponding to EP application No. 20189538, dated Nov. 5, 2020, 12 pages.

* cited by examiner

PHOSPHOR PARTICLE COATING

CROSS-REFERENCE TO RELATED APPLICATIONS

CROSS REFERENCE TO RELATED APPLICATIONS

This application is a 371 national phase entry of International Application No. PCT/US2021/039514 filed Jun. 29, 2021, which claims benefit of priority to U.S. application Ser. No. 16/915,422 titled "Phosphor Particle Coating" filed 29 Jun. 2020 and, EP Application No. 20189538.0 filed 5 Aug. 2020 titled "Phosphor Particle Coating," said applications being incorporated herein by reference their entireties.

FIELD OF THE INVENTION

The invention relates to a method for providing a coated luminescent material, to such luminescent material, as well as to a lighting device comprising such luminescent material for wavelength conversion.

BACKGROUND OF THE INVENTION

The coating of luminescent materials is known in the art. WO2014128676, for instance, describes a coated luminescent particle, a luminescent converter element, a light source, a luminaire and a method of manufacturing coating luminescent particles. The coated luminescent particle comprises a luminescent particle, a first coating layer and a second coating layer. The luminescent particle comprises luminescent material for absorbing light in a first spectral range and for converting the absorbed light towards light of a second spectral range. The luminescent material is sensitive for water. The first coating layer forms a first barrier for water and comprises a metal oxide or a nitride, phosphide, sulfide based coating. The second coating layer forms a second barrier for water and comprises a silicon based polymer or comprises a continuous layer of one of the materials $AlPO_4$, $SiO_2$, $Al_2O_3$, and $LaPO_4$. The first coating layer and the second coating layer are light transmitting. The first coating layer encapsulates the luminescent particle and the second coating layer encapsulates the luminescent particle with the first coating layer.

SUMMARY OF THE INVENTION

Moisture sensitive luminescent powder materials can be coated with a layer of an amorphous or glassy material to reduce decomposition rates by moisture attack. The coating may be applied by depositing a material at the particle surfaces by reacting a dissolved inorganic precursor in a suspension (e.g. by a sol-gel process) or by deposition from the gas phase (e.g. a chemical vapor deposition or an atomic layer deposition (ALD) process).

Atomic layer deposition could be a suitable method to deposit thin, conformal coatings of various inorganic materials on powder particles. ALD layers may be very dense and conformal and may be substantially impermeable to gases like water vapor and oxygen.

The ALD process further allows the deposition of multiple thin layers (nanolaminate) of different inorganic materials that each may provide physical properties to the layer (like moisture resistance, light transmissivity, stress resistance, elasticity, etc.) that may be different for the different (nano)layers.

Sol-gel process may be suitable for providing (relatively) thicker layers that may provide mechanical protection to the material coated with the layer.

Known coated luminescent particles may show one or more disadvantages, such as decomposition of the luminescent material due to moisture or e.g. solvents, degradation as a result of high temperatures, mechanical instability during processing the luminescent particles. Further, also many of the known coating processes have one or more disadvantages such as agglomeration, decrease in quantum efficiency of the coated luminescent material (relative to the uncoated material), non-conformal coatings.

It appears that with a sol-gel coating process only the properties of the luminescent materials may not be sufficient. Furthermore, moisture sensitive luminescent particles comprising only an ALD coating may also not be durable when being exposed to mechanical stress. It further appears that moisture sensitive luminescent particles with a sol-gel coating in combination with an ALD coating configured on top of the sol-gel coating may provide luminescent particles with a reduced decomposition rate due to moisture attack at relatively hard conditions such as at temperatures up to 60° C. and a 90% relative humidity. Yet, for higher temperatures, such as that may be generated in high-power LED applications, e.g. in flash and automotive applications alternative coating structures may be desirable. Further, ALD layers appear to show an intrinsic (tensile) stress, that may increase with increasing layer thickness. ALD coatings may preferably be provided as thin layers. Yet, it appears that deposition of especially a thin ALD layer may be sensitive to surface contamination. Possible contamination at the surface of the particle to be coated may result in pinholes or other irregularities in the (thin) ALD layer.

Hence, it is an aspect of the invention to provide an alternative coating process, which preferably further at least partly obviates one or more of above-described drawbacks. It is a further aspect of the invention to provide an alternative luminescent material that preferably further at least partly obviates one or more of above-described drawbacks. In yet a further aspect, the invention provides a lighting device comprising the luminescent material that preferably further at least partly obviates one or more of above-described drawbacks.

The present invention may have as object to overcome or ameliorate at least one of the disadvantages of the prior art, or to provide a useful alternative.

Amongst others, the invention proposes in embodiments a coating structure comprising at least two layers, especially at least three layers configured around a luminescent core. The different layers may be selected from having different functions. The coating structure may especially comprise a primer layer, a coating layer provided by atomic layer deposition (an "ALD coating layer"), and a coating layer provided by a sol-gel (deposition) process (a "sol-gel coating layer"). The primer layer may facilitate good adherence between the surface and facilitate deposition of a thin ALD coating layer. The ALD coating layer may shield the luminescent core from undesired gases like water vapor and oxygen or further chemicals. The sol-gel coating may provide mechanical protection to the luminescent core and the ALD coating layer.

Hence, herein a hybrid coating method is provided for a luminescent powder material that consist of depositing a coating layer at a primer layer (at a surface of a luminescent core) by application of an ALD process and successively depositing a sol-gel layer by application of a sol-gel type process to obtain a uniformly coated luminescent particle. With the method a luminescent particle with a hybrid coating may be provided.

Hence in a first aspect, the invention provides a method for providing a luminescent particle with a hybrid coating. In embodiments, the method especially comprises (the stages of) (i) providing a luminescent core ("core") comprising a primer layer ("primer coating" or "primer coating layer") on the luminescent core (or a "primer layer comprising luminescent core"). The method further comprising: (ii) providing a(n) (main) atomic layer deposition coating layer ("(main) ALD coating layer" or "(main) ALD coating" or "(main) ALD layer") onto the primer layer. The (main) ALD-coating layer is in embodiments, especially provided onto the primer layer comprising luminescent core. The method further comprising: (iii) providing a (main) sol-gel coating layer ("(main) sol-gel coating" or "(main) sol-gel layer") onto the (main) ALD coating layer. Further, the (main) ALD coating layer may be provided onto the primer layer by application of an (main) atomic layer deposition process ("(main) ALD process"). Further, in specific embodiments, the (main) ALD coating layer may comprise a multilayer (or "laminate") with two or more layers having different chemical compositions. In further specific embodiments, in the (main) atomic layer deposition process, a metal oxide precursor is selected from a group of metal oxide precursors comprising Al, Zn, Hf, Ta, Zr, Ti, Sn, Nb, Y, Ga, and V (and optionally Si). The (main) sol-gel coating layer is especially provided onto the (main) ALD coating layer by application of a (main) sol-gel coating process. In further embodiments, the main sol-gel coating layer may have a chemical composition different from one or more of the layers of the multilayer.

In yet a further aspect, the invention also provides a luminescent material comprising the luminescent particles obtained by such method. Especially, the invention provides in yet a further aspect, a luminescent material comprising luminescent particles, wherein the luminescent particles comprise a luminescent core comprising a primer layer on the luminescent core, especially wherein the primer layer has a primer layer thickness (d1) in the range of 0.1-10 nm, especially 0.1-7 nm, such as 0.1-5 nm or 0.1-4 nm, and wherein the primer layer has a chemical composition differing from the chemical composition of the core; a(n) (main) ALD (i.e., atomic layer deposition) coating layer, especially comprising a multilayer with two or more layers having different chemical compositions, wherein, in embodiments, the (main) ALD coating has a(n) (main) ALD coating layer thickness (d2) in the range of 5-250 nm, such as 5-100 nm, especially 5-50 nm, such as especially 10-50 nm, even more especially 20-50 nm, and especially wherein the multilayer comprises one or more layers comprising an oxide of one or more of Al, Zn, Hf, Ta, Zr, Ti, Sn, Nb, Y, Ga, and V (and optionally Si), wherein one or more of the two or more layers of the multilayer have chemical compositions differing from the chemical composition of the primer layer, and further, in embodiments, especially comprising a (main) sol-gel coating layer, wherein, in embodiments, the (main) sol-gel coating has a (main) sol-gel coating layer thickness (d3) in the range of 50-700 nm, such as 50-600 nm, especially 75-500 nm, such as especially 100-500 nm. In further embodiments, the (main) sol-gel coating layer has a chemical composition differing from the (main) ALD coating layer, especially from one or more of the two or more layers of the multilayer. Further, especially, the (main) ALD coating layer is arranged between the primer layer and the (main) sol-gel layer.

The invention may provide luminescent particles and luminescent material, i.e. luminescent material comprising these (hybrid coated) particles, showing a significantly reduced decomposition rate as a result of moisture attack. The coating of the luminescent particles may demonstrate improved moisture barrier properties. The coating may further provide an improved chemical and mechanical stability allowing the integration of luminescent particle (phosphors), especially of moisture sensitive luminescent particles (phosphors) in high-power products e.g. for flash and automotive applications imposing high stress conditions (like working temperatures up to 85° C., at a high relative humidity (over 80% relative humidity). With such luminescent material, a relative stable luminescent material is provided with quantum efficiencies close to or identical to the virgin (non-coated) luminescent material and having stabilities against water and/or (humid) air which are very high and superior to non-coated or non-hybrid coated luminescent particles.

The invention may especially provide in embodiments a method for providing a luminescent particle with a hybrid coating, the method comprising: (i) providing a luminescent core comprising a primer layer on the luminescent core; (ii) providing a main ALD coating layer onto the primer layer by application of a main atomic layer deposition process, the main ALD coating layer comprising a multilayer with two or more layers having different chemical compositions, and wherein in the main atomic layer deposition process a metal oxide precursor is selected from a group of metal oxide precursors comprising Al, Zn, Hf, Ta, Zr, Ti, Sn, Nb, Y, Ga, and V (and optionally Si); (iii) providing a main sol-gel coating layer onto the main ALD-coating layer by application of a main sol-gel coating process, the main sol-gel coating layer having a chemical composition different from one or more of the layers of the multilayer. Especially, in the main atomic layer deposition process, the metal oxide precursor is selected from a group of metal oxide precursors of metals selected from a group consisting of Al, Zn, Hf, Ta, Zr, Ti, Sn, Nb, Y, Ga, and V (and optionally Si).

Hence, the starting material is a particulate luminescent material or a luminescent material that is made particulate. Further, especially the luminescent core is a particulate core or luminescent (core) material that is made particulate. The core may essentially be a (virgin) luminescent particle/core, i.e. a non-coated/non-treated luminescent particle. The luminescent particles of the particulate luminescent material (especially the core(s)) are coated as described herein. The terms "luminescent particles", "luminescent core" and similar terms indicate that the particles and/or cores luminesce under excitation with especially UV and/or blue radiation (light source radiation, see below). Herein, also the term "luminescent particle" may be used to refer to the "luminescent core". Moreover, herein also the coated luminescent particles may be referred to as "luminescent particles". It will be clear from the context whether the term "luminescent particle" refers to a core that is not coated or e.g. that it refers to the luminescent particle comprising the hybrid coating, or to a luminescent particle comprising only one or more layers of the hybrid coating.

The luminescent core (before applying the ALD coating process) especially comprises a primer layer on (a surface of) the luminescent core. Herein, the luminescent core comprising the primer layer (on the luminescent core) is also referred to as a "primer layer comprising luminescent core". In embodiments, the virgin (core) material (already) comprises the primer layer. In embodiments, e.g., the core may comprise an oxide-containing surface. In further embodiments, the primer layer may be provided to the virgin (core) material, especially with the method of the invention. Hence, in further embodiments, the method may comprise providing a primer layer onto a core(, to provide the luminescent core comprising the primer layer on the luminescent core) (see further below).

The primer layer not necessarily is entirely conformal with the core. The primer layer may especially be evenly distributed over (the surface of) the luminescent core. However, the primer layer, may in embodiments not entirely cover the surface of the core. The primer layer may in embodiments cover the core for at least 50%, especially at least 75%, such as at least 90%, or especially at least 95% or even more especially at least 99%, of the surface of the core (see further below). The primer layer may especially be configured to facilitate the deposition of the main ALD coating layer. The primer layer may function as a nucleation layer or a seed layer for the main ALD coating layer.

The main ALD coating layer is provided onto the primer layer. Hence, in embodiments the ALD coating layer may contact the surface of the luminescent core at first locations of the luminescent core comprising the primer layer, and the ALD coating layer may contact the primer layer at further locations. The main ALD coating layer may optionally include a multilayer. However, the multilayers of the main ALD coating layer are all ALD layers. Therefore, this layer is indicated as (main) ALD (coating) layer (thus optionally including an ALD multilayer). Especially the main ALD coating layer comprises a multilayer with two or more layers (having different chemical compositions), see also below. The main ALD coating layer especially at least includes one or more aluminum oxide (especially $Al_2O_3$) coating layers.

Likewise, the main sol-gel coating layer may optionally include a multilayer. However, the (multi-)layers of the main sol-gel coating layer are all sol-gel layers. Therefore, this coating layer is herein also indicated as a (main) sol-gel (coating) layer (thus optionally including a sol-gel multilayer). Further, especially the main sol-gel coating layer is provided on the main ALD coating layer, without an intermediate layer. The main sol-gel coating layer especially comprises silicon oxide (especially $SiO_2$). An example of a multilayer may e.g. include a $SiO_2$—$Al_2O_{3-x}(OH)_{2x}$ (sol-gel) multilayer (wherein $0 \leq x \leq 3$), such as a stack of three or more (sol-gel) layers wherein $SiO_2$ and $Al_2O_{3-x}(OH)_{2x}$ (with $0 \leq x \leq 3$) alternate. Optionally on the main sol-gel coating layer a further coating layer may be provided (see further below).

Especially, both the main ALD coating layer and the main sol-gel coating layer independently comprise metal oxides, though optionally also hydroxides may be included in the one or more of these layers. Further, independently the main ALD coating layer and the main sol-gel coating layer may include mixed oxide layers. Further, the coating layers need not necessarily to be fully stoichiometric oxides, as is known in the art.

In embodiments, the primer layer (also) comprises a sol-gel coating layer (provided by application of a sol-gel process). Herein, such sol-gel coating layer may be indicated as a primary sol-gel coating layer, especially to distinguish from the main sol-gel coating layer. The primary sol-gel coating layer may in embodiments comprise metal oxides, and optionally hydroxides, as described herein in relation to the main sol-gel coating layer. Further, especially, the primary sol-gel coating layer may be provided as described in relation to the main sol-gel coating layer, see also below, further describing the sol-gel process. The primary sol-gel coating layer may especially be provided (and comprise a composition) as described in relation with the main sol-gel coating.

The primer layer may in further embodiments (also) (further) comprise an oxide-containing layer. In specific embodiments, the oxide-containing layer is provided by application of a chemical washing process onto the luminescent core (see further below). The chemical washing process may especially provide a washing result layer onto the luminescent core. Hence, in embodiments, the washing result layer comprises the oxide-containing layer. The primer layer may especially function as a nucleation layer or a seed layer for the main ALD coating layer. Yet, the primer layer may be structurally different for various embodiments. As described above, in embodiments, the primer layer comprises, especially consist of an oxide-containing layer (or oxide-rich layer) (at the surface of the luminescent core). In further embodiments, the primer layer comprises, especially consist of the washing result layer. In further embodiments, the primer layer comprises, especially consists of the primary sol-gel coating layer. In further specific embodiments, the primer layer comprises the washing result layer and the primary sol-layer.

Especially (if the core is subjected to the chemical washing process), the primary sol-gel coating layer is provided after the chemical washing process, and especially the primary sol-gel coating may be provided on the washing result layer (especially the oxide-containing layer). Yet, in such embodiments, the primary sol-gel coating layer may contact the washing result layer at a first location of the luminescent core. The primary sol-gel coating may contact the surface of the luminescent core at other locations of the luminescent core. Hence, in embodiments, the primer layer comprises an oxide-containing layer and a primary sol-gel layer, especially wherein the oxide-containing layer is arranged at a surface of the core (and at least part of the primary sol-gel coating layer is arranged at the oxide-containing layer).

As is described above, in embodiments, locations of the core may not be covered by the primary layer (especially the one or more of the oxide-containing layer and the primary sol-gel coating layer). Hence, in embodiments, the main ALD coating layer may (be provided to) contact the primary sol-gel coating layer at some locations of the luminescent core and the main ALD coating layer may (be provided to) contact the surface of the core at some other locations of the luminescent particle. In yet further embodiments, the main ALD coating may (also) (be provided to) contact the washing result layer at some further locations of the luminescent particle.

In general, the thickness of the primer layer is smaller than the thickness of the main sol-gel layer, and especially also smaller than the thickness of the main ALD coating layer. Further, especially the main sol-gel coating layer thickness is generally larger than the ALD coating layer thickness. The primer layer thickness is especially equal to or smaller than 10 nm, such as equal to or smaller than 7 nm, especially equal to or smaller than 5 nm, even more especially equal to or smaller than 4 nm. The primer layer thickness may in embodiments be at least 0.1 nm, such as at least 0.2 nm, especially at least 0.5 nm, such as especially at least 1 nm. The primary layer thickness may especially be the result of the thickness of the primary sol-gel coating layer. Hence, especially the primary sol-gel coating layer may be equal to or smaller than 10 nm, such as equal to or smaller than 7 nm, especially equal to or smaller than 5 nm, such as equal to or smaller than 4 nm. The oxide-containing layer may in embodiments be less than 1 nm thick. In embodiments the primer layer has a primer layer thickness (d1) in the range of 0.1-5 nm. In further embodiments, the primer layer comprises a primary sol-gel layer provided by application of a primary sol-gel coating process. The thickness of main sol-gel coating layer may be at least 10 times, such as at least 50 times, especially at least 100 times thicker than the thickness of the primary layer.

Further, especially the main sol-gel coating layer thickness is generally larger than the main ALD coating layer thickness, such as at least 1.2, like at least 1.5, like at least 2 times larger, or even at least 4 times or at least 5 times or at least 10 times larger (than the main ALD coating layer thickness).

In specific embodiments, the method of the invention comprises (i) providing the primer layer, especially having a primer layer thickness (d1) in the range of 0.1-10 nm, especially 0.1-7 nm, such as 0.1-5 nm or 0.1-4 nm, onto the core (to provide the primer layer comprising luminescent core); (ii) providing the main ALD coating layer having a main ALD coating layer thickness (d2) in the range of 3-250 nm, such as 5-250 nm, especially 5-100 nm, even more especially 5-50 nm, such as especially 10-50 nm, even more especially 20-50 nm, onto the primer layer (especially onto the primer layer comprising luminescent core) by application of the main atomic layer deposition process; and especially (iii) providing the main sol-gel coating layer having a main sol-gel coating layer thickness (d3) in the range of 50-700 nm, such as 50-600 nm, especially 75-500 nm, such as especially 100-500 nm onto the main ALD coating layer, by application of the main sol-gel process.

Especially, the primer layer has a primer layer thickness (d1) in the range of 0.1-10 nm, especially 0.1-7 nm, such as 0.1-5 nm or 0.1-4 nm. Further, especially the main ALD coating layer has a main ALD coating layer thickness (d2) in the range of 3-250 nm, such as 5-250 nm, especially 5-100 nm, even more especially 5-50 nm, such as especially 10-50 nm, even more especially 20-50 nm. Especially, the main sol-gel coating layer has a main sol-gel coating layer thickness (d3) in the range of 50-700 nm, such as 50-600 nm, especially 75-500 nm, such as especially 100-500 nm.

Hence, as indicated above, the luminescent particle comprises in embodiments a luminescent core, a primer layer having a primer layer thickness (d1) in the range of 0.1-10 nm, especially 0.1-7 nm, such as 0.1-5 nm or 0.1-4 nm, a main ALD coating layer having a main ALD coating layer thickness (d2) in the range of 3-250 nm, such as 5-250 nm, especially 5-100 nm, even more especially 5-50 nm, such as especially 10-50 nm, even more especially 20-50 nm, and a main sol-gel coating layer having a main sol-gel coating layer thickness (d3) in the range of 50-700 nm, such as 50-600 nm, especially 75-500 nm, such as especially 100-500 nm.

In embodiments, the primer layer at least partly encapsulates the surface of the luminescent core. In further embodiments, the main ALD coating encapsulates the primer layer. In further embodiments the main sol-gel coating encapsulates the main ALD coating layer. In yet further embodiments, a further ALD coating layer encapsulates the main sol-gel coating layer (see below). Hence, the hybrid coating may comprise a main ALD coating layer and a main sol-gel coating layer, especially a primer layer, a main ALD coating layer, and a main sol-gel coating layer. The primer layer is especially arranged between the surface of the luminescent core and the main ALD coating layer. The main ALD coating layer is especially arranged between the main sol-gel coating layer and the primer layer.

In yet further embodiments, the luminescent particle may comprise a further coating layer arranged on the main sol-gel coating layer. In further embodiments, the hybrid coating further comprises the further coating layer arranged at the main-sol-gel coating layer. The further coating layer may especially comprise a further ALD coating layer, especially encapsulating the main sol-gel coating. Hence, in embodiments, the luminescent particle (further) comprises a further ALD coating layer arranged onto the main sol-gel coating layer. The further ALD coating layer especially has a further ALD coating layer thickness (d4) in the range of 1-100 nm, such as 5-75 nm, especially 10-75 nm, such as especially 10-50 nm. Further, especially the further ALD coating layer has a chemical composition differing from the chemical composition of the main sol-gel coating layer.

Hence, in specific embodiments, the method further comprises (iv) providing a further ALD coating layer onto the main sol-gel coating by application of a further atomic layer deposition process (especially thereby providing a further ALD coated luminescent particle), especially wherein the further ALD coating layer has a further ALD coating layer thickness (d4) in the range of 1-100 nm, such as 5-75 nm, especially 10-75 nm, such as especially 10-50 nm, and especially wherein the further ALD coating layer has a chemical composition differing from the chemical composition of the main sol-gel coating layer. The further ALD coating layer may be provided by an ALD process described herein, especially in relation to the main ALD layer. The further ALD layer may (also) comprise a multilayer. The further ALD layer may further especially comprise a composition (and/or the (metal) oxides) described in relation to the main ALD layer. In embodiments, the further ALD coating layer comprises one or more oxides of one or more of Al, Zn, Hf, Ta, Zr, Ti, Sn, Nb, Y, Ga, and V, and optionally Si.

Herein the term "thickness" is used in relation to the coatings and layers. The term especially relates to the average thickness of the coating over the entire surface being coated by the respective layer. For instance, the primary layer may not completely cover the surface of the core and the (local) thickness of primer layer may be substantially zero at locations of the surface core. At other locations of the surface, the maximum (local) thickness of the primer layer may be 3 nm. Then, e.g., the primer layer thickness may be in the range of larger than 0 and smaller than 3 nm. Moreover, also if the (coating) layer completely covers the core or another coating layer, locally the thickness may vary. Especially, e.g., the sol-gel process may provide coating layers having a somewhat pocked shape or e.g. may comprise one or more little pinholes. Hence, the layer thicknesses described herein are especially average layer thicknesses. However especially, at least for the primer layer, the main sol gel coating layer, the main ALD coating layer and the further ALD coating layer (when present), at least 50%, even more especially at least 80%, of the area of the respective layers have such indicated layer thickness. Especially, this indicates that under at least 50% of the area of such layer, such thickness will be found.

The luminescent core of interest may in principle include each type of (virgin) luminescent particle or particulate material. However, especially of interest are those type of luminescent particulate materials (particles) that may be less stable in air or water or a humid environment, such as e.g. (oxo)sulfides, (oxo)nitrides, etc. Hence, in embodiments the luminescent core (and the luminescent particle comprising the luminescent core) comprises one or more of a nitride luminescent material, an oxonitride luminescent material, a halogenide luminescent material, an oxohalogenide luminescent material, a sulfide luminescent material, and an oxosulfide luminescent material. Additionally or alternatively, the luminescent core (luminescent particle) may comprise a selenide luminescent material. Hence, the term "luminescent core" (and also "luminescent particle") may also refer to a combination of particulate materials of different types of luminescent materials. The luminescent core may in embodiments especially comprise a plurality of particulate luminescent materials/luminescent particles.

In a specific embodiment, the luminescent core (or the material of the luminescent core) may be selected from the following group of luminescent material systems: $MLiAl_3N_4$:Eu (M=Sr, Ba, Ca, Mg), $MLi_2Al_2O_2N_2$:Eu (M=Ba, Sr, Ca), $M_2SiO_4$:Eu (M=Ba, Sr, Ca), $MSe_{1-x}S_x$:Eu (M=Sr, Ca, Mg), $MA_2S_4$:Eu (M=Sr, Ca, A=Al, Ga)), $M_2SiF_6$:Mn (M=Na, K, Rb), $MSiAlN_3$:Eu (M=Ca, Sr), $M_8{}^{Mg}(SiO_4)_4Cl_2$:Eu (M=Ca, Sr), $M_3MgSi_2OS$:Eu (M=Sr, Ba, Ca), $MSi_2O_2N_2$:Eu (M=Ba, Sr, Ca), $MLi_3SiO_4$:Eu (M=Li, Na, K, Rb, Cs), $M_2Si_{5-x}Al_xO_xN_{8-x}$:Eu (M=Sr, Ca, Ba). However, other systems may also be of interested to protect by the hybrid coating. Also combinations of particles/particulate materials of two or more different luminescent materials may be applied, such as e.g. a green or a yellow luminescent material in combination with a red luminescent material.

Terms like "M=Sr, Ba, Ca, Mg" indicate, as known in the art, that M includes one or more of Sr, Ba, Ca, and Mg. For instance, referring to $MSiAlN_3$:Eu (M=Ca, Sr), this may refer by way of examples to $CaSiAlN_3$:Eu, or to $SrSiAlN_3$:Eu, or to $Ca_{0.8}Sr_{0.2}SiAlN_3$:Eu, etc. etc. Further, the formula "$MLiAl_3N_4$:Eu (M=Sr, Ba, Ca, Mg)," is equal to the formula $(Sr,Ba,Ca,Mg)LiAl_3N_4$:Eu. Further, for clarity reasons also the formula "$(M1)LiAl_3N_4$:Eu, with M1=Sr, Ba, Ca" and the like may be used, e.g., when more than one group is indicated with different elements, for instance in a sentence like "wherein the luminescent material is selected from a group consisting of $(M1)Li_dMg_aAl_bN_4$:Eu, with $0 \le a \le 4$; $0 \le b \le 4$; $0 \le d \le 4$, and M1 comprising one or more of the group consisting of Ca, Sr, and Ba; and $(M2)Li_2Al_{2-z}Si_zO_{2-z}N_{2+z}$:Eu, wherein $0 \le z \le 0.1$, and M2 comprising one or more of the group consisting of Sr and Ba". Further, also M1, M2, et cetera may refer to one or more of the (respective) elements. In the above given example, e.g. M1 may in embodiments be Sr, or Ba, or Ca. In further embodiments M1 may be combination of Sr and Ba, or e.g. Sr and Ca, or Sr, Ba, and Ca, etc. Moreover, the elements may especially be present in any ratio, e.g. 20% Sr, 20% Ca and 50%. Ba, or 10% Ba and 90% Sr, etc. Likewise this applies to the other herein indicated formulas of inorganic luminescent materials.

In further specific embodiments, the luminescent core may be selected from the following group of luminescent material systems: $M_{1-x-y-z}Z_zA_aB_bC_cD_dE_eN_{4-n}O_n$:ES$_x$,RE$_y$, with M=selected from a group consisting of Ca (calcium), Sr (strontium), and Ba (barium); Z selected from a group consisting of monovalent Na (sodium), K (potassium), and Rb (rubidium); A=selected from a group consisting of divalent Mg (magnesium), Mn (manganese), Zn (zinc), and Cd (cadmium) (especially, A=selected from a group consisting of divalent Mg (magnesium), Mn (manganese), and Zn (zinc), even more especially selected from a group consisting of divalent Mg (magnesium), Mn (manganese); B=selected from a group consisting of trivalent B (boron), Al (aluminum) and Ga (gallium); C=selected from a group consisting of tetravalent Si (silicon), Ge (germanium), Ti (titanium) and Hf (hafnium); D selected from a group consisting of monovalent Li (lithium), and Cu (copper); E selected for the group consisting of P (the element phosphor), V (vanadium), Nb (niobium), and Ta (tantalum); ES=selected from a group consisting of divalent Eu (europium), Sm (samarium) and ytterbium, especially selected from a group consisting of divalent Eu and Sm; RE=selected from a group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium); with $0 \le x \le 0.2$; $0 \le y \le 0.2$; $0 < x+y \le 0.4$; $0 \le z < 1$; $0 \le n \le 0.5$; $0 \le a \le 4$ (such as $2 \le a \le 3$); $0 \le b \le 4$; $0 \le c \le 4$; $0 \le d \le 4$; $0 \le e \le 4$; $a+b+c+d+e=4$; and $2a+3b+4c+d+5e=10-y-n+z$. Especially, $z \le 0.9$, such as $z \le 0.5$. Further, especially $x+y+z \le 0.2$.

The equations $a+b+c+d+e=4$; and $2a+3b+4c+d+5e=10-y-n+z$, respectively, especially determine the Z, A, B, C, D and E cations and O and N anions in the lattice and thereby define (also) the charge neutrality of the system. For instance, the charge compensation is covered by the formula $2a+3b+4c+d+5e=10-y-n+z$. It covers e.g. charge compensation by decreasing O content or charge compensation by substituting a C cation by a B cation or a B cation by an A cation, etc. For example: $x=0.01$, $y=0.02$, $n=0$, $a=3$; then $6+3b+4c=10-0.02$; with $a+b+c=4$; $b=0.02$, $c=0.98$.

As will be clear to a person skilled in the art, a, b, c, d, e, n, x, y, z are always equal to or larger than zero. When a is defined in combination with the equations $a+b+c+d+e=4$; and $2a+3b+4c+d+5e=10-y-n+z$, then in principle, b, c, d, and e do not need to be defined anymore. However, for the sake of completeness, herein also $0 \le b \le 4$; $0 \le c \le 4$; $0 \le d \le 4$; $0 \le e \le 4$ are defined.

Assume a system like $SrMg_2Ga_2N_4$:Eu. Here, $a=2$, $b=2$, $c=d=e=y=z=n=0$. In such system, $2+2+0+0+0=4$ and $2*2+3*2+0+0+0=10-0-0+0=10$. Hence, both equations are complied with. Assume that 0.5 O is introduced. A system with 0.5 O can e.g. be obtained when 0.5 Ga—N is replaced by 0.5 Mg—O (which is a charge neutral replacement). This would result in $SrMg_{2.5}Ga_{1.5}N_{3.5}O_{0.5}$:Eu. Here, in such system $2.5+1.5+0+0+0=4$ and $2*2.5+3*1.5+0+0+0=10-0-0.5+0=9.5$. Hence, also here both equations are complied with.

As indicated above, in advantageous embodiments $d>0$ and/or $z>0$, especially at least $d>0$. Especially, the phosphor comprises at least lithium. In yet another embodiment, $2 \le a \le 3$, and especially also $d=0$, $e=0$ and $z=0$. In such instances, the phosphor is amongst others characterized by $a+b+c=4$; and $2a+3b+4c=10-y-n$.

In a further specific embodiment, which may be combined with the former embodiments $e=0$. In yet a further specific embodiment, which may be combined with the former embodiments, M is Ca and/or Sr.

Hence, in a specific embodiment, the phosphor has the formula M(Ca and/or Sr)$_{1-x-y}$Mg$_a$Al$_b$Si$_c$N$_{4-n}$O$_n$:ES$_x$,RE$_y$ (I), with ES=selected from a group consisting of divalent Eu (europium) or Sm (samarium) or Yb (ytterbium); RE=selected from a group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium), wherein $y/x<0.1$, especially $<0.01$, and $n \le 0.1$, especially $<0.01$, even more especially $<0.001$, yet even more especially $<0.0001$. Hence, in this embodiment, substantially samarium and or europium containing phosphors are described. For instance, when divalent Eu is present, with $x=0.05$, and for instance y1 for Pr may be 0.001, and y2 for Tb may be 0.001, leading to an $y=y1+y2=0.002$. In such instance, y/x=0.04. Even more especially, y=0. However, as indicated elsewhere when Eu and Ce are applied, the ratio y/x may be larger than 0.1.

The condition $0<x+y\leq0.4$ indicates that M may be substituted with in total up to 40% of ES and/or RE. The condition "$0<x+y\leq0.4$" in combination with x and y being between 0 and 0.2 indicates that at least one of ES and RE are present. Not necessarily both types are present. As indicated above, both ES and RE may each individually refer to one or more subspecies, such as ES referring to one or more of Sm and Eu, and RE referring to one or more of Ce, Pr, Nd, Sm, Eu, Gd, Tb, Dy, Ho, Er, and Tm.

Especially, when europium is applied as divalent luminescent species or dopant (i.e. $Eu^{2+}$), the molar ratio between samarium and europium (Sm/Eu) is <0.1, especially <0.01, especially <0.001. The same applies when europium in combination with ytterbium would be applied. When europium is applied as divalent luminescent species or dopant, the molar ratio between ytterbium and europium (Yb/Eu) is <0.1, especially <0.01, especially <0.001. Would all three together be applied, then the same molar ratios might apply, i.e. ((Sm+Yb)/Eu) is <0.1, especially <0.01, especially <0.001.

Especially, x is in the range of 0.001-0.2 (i.e. $0.001\leq x\leq0.2$), like 0.002-0.2, such as 0.005-0.1, especially 0.005-0.08. Especially in the case of divalent Europium in the herein described systems, the molar percentage may be in the range of 0.1-5% ($0.001\leq x\leq0.05$), such as 0.2-5%, like 0.5-2%. For other luminescent ions, x may (but is not necessarily) in embodiments be equal to or larger than 1% (x equal to or larger than 0.01).

In a specific embodiment, the phosphor is selected from a group consisting of $(Sr,Ca)Mg_3SiN_4$:Eu, $(Sr,Ca)Mg_2Al_2N_4$:Eu, $(Sr,Ca)LiAl_3N_4$:Eu and $(Sr,Ca)Li_dMg_aAl_bN_4$:Eu, with a, b, d as defined above.

As also indicated herein, the notation "(Sr,Ca)", and similar notations with other elements, indicates that the M-positions are occupied with Sr and/or Ca cations (or other elements, respectively).

In a further specific embodiments the phosphor is selected from a group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, $BaMg_3SiN_4$:Eu, $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu. Further (non-limiting) examples for such phosphors are e.g. $(Sr_{0.5}Ca_{0.2})_{0.995}LiAl_{2.91}Mg_{0.09}N_{3.91}O_{0.09}$:Eu$_{0.005}$; $(Sr_{0.9}Ca_{0.1})_{0.905}Na_{0.09}LiAl_3N_{3.91}O_{0.09}$:Eu$_{0.005}$; $(Sr_{0.8}Ca_{0.03}Ba_{0.17})_{0.989}LiAl_{2.99}Mg_{0.01}N_4$:Ce$_{0.01}$,Eu$_{0.001}$; $Ca_{0.995}LiAl_{2.995}Mg_{0.005}N_{3.995}O_{0.005}$:Yb$_{0.005}$ (YB(II)); $Na_{0.995}MgAl_3N_4$:Eu$_{0.005}$; $Na_{0.895}Ca_{0.1}Mg_{0.9}Li_{0.1}Al_3N_4$:Eu$_{0.005}$; $Sr_{0.99}LiMgAlSiN_4$:Eu$_{0.01}$; $Ca_{0.995}LiAl_{2.955}Mg_{0.045}N_{3.96}O_{0.04}$:Ce$_{0.005}$; $(Sr_{0.9}Ca_{0.1})_{0.998}Al_{1.99}Mg_{2.01}N_{3.99}O_{0.01}$:Eu$_{0.002}$; $(Sr_{0.9}Ba_{0.1})_{0.998}Al_{1.99}Mg_{2.01}N_{3.99}O_{0.01}$:Eu$_{0.002}$.

In a further specific embodiment, the phosphor is selected from a group consisting of $(Sr,Ca)Mg_3SiN_4$:Eu and $(Sr,Ca)Mg_2Al_2N_4$:Eu. In yet another specific embodiment, the phosphor is selected from a group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, and $BaMg_3SiN_4$:Eu. Especially, these phosphors, and even more especially $(Sr,Ca)Mg_3SiN_4$:Eu and $(Sr,Ca)Mg_2Al_2N_4$:Eu may be phosphors having good luminescent properties, amongst others in terms of spectral position and distribution of the luminescence.

In further specific embodiments the phosphor, especially the luminescent material, is selected from a group consisting of $(Sr,Ca)LiAl_3N_4$:Eu and $(Sr,Ca,Ba)Li_dMg_aAl_bN_4$:Eu, with $0\leq a\leq4$; $0\leq b\leq4$; $0\leq d\leq4$; and a+b+d=4 and 2a+3b+d=10. In yet another specific embodiment, the phosphor is selected from a class of $(Sr,Ba)Li_2Al_{2-z}Si_zO_{2-z}N_{2+z}$:Eu with $0\leq z\leq0.1$.

The luminescent material is in embodiments selected from a group $SrLiAl_3N_4$:Eu. The luminescent material may e.g. comprise $SrLiAl_3N_4$:Eu with an Eu doping concentration in the range 0.1-5%, especially 0.1-2%, such as 0.2-1.2% relative to Sr.

In further specific embodiments, the phosphor/luminescent core (the luminescent material) comprises $SrLi_2Al_{1.995}Si_{0.005}O_{1.995}N_{2.005}$:Eu$^{2+}$, especially with an Eu doping concentration in the range 0.1-5%, especially 0.1-2%, 0.2-1.5% relative to Sr.

Of especial interest are phosphors wherein the phosphor complies with $0\leq x\leq0.2$, y/x<0.1, M comprises at least Sr, $z\leq0.1$, $a\leq0.4$, $2.5\leq b\leq3.5$, B comprises at least Al, $c\leq0.4$, $0.5\leq d\leq1.5$, D comprises at least Li, $e\leq0.4$, $n\leq0.1$, and wherein ES at least comprises Eu. Especially, $y+z\leq0.1$. Further, especially $x+y+z\leq0.2$. Further, especially a is close to 0 or zero. Further, especially b is about 3. Further, especially c is close to 0 or zero. Further, especially d is about 1. Further, especially e is close to 0 or zero. Further, especially n is close to 0 or zero. Further, especially y is close to 0 or zero. Especially good systems, in terms of quantum efficiency and hydrolysis stability are those with z+d>0, i.e. one or more of Na, K, Rb, Li and Cu(I) are available, especially at least Li, such as e.g. $(Sr,Ca)LiAl_3N_4$:Eu and $(Sr,Ca)Li_dMg_aAl_bN_4$:Eu, with a, b, d as defined above. In further specific embodiments the phosphor is selected from a group consisting of $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu. Further phosphors of special interest are $(Sr,Ca,Ba)(Li,Cu)(Al,B,Ga)_3N_4$:Eu, which comprises as M ion at least Sr, as B ion at least Al, and as D ion at least Li.

In embodiments, the phosphor (the luminescent core) is selected from a group consisting of $(M1)Li_dMg_aAl_bN_4$:Eu, with $0\leq a\leq4$; $0\leq b\leq4$; $0\leq d\leq4$, and M1 comprising one or more (elements selected) from a group consisting of Ca, Sr, and Ba; and a+b+d=4 and 2a+3b+d=10; and $(M2)Li_2Al_{2-z}Si_zO_{2-z}N_{2+z}$:Eu, wherein $0\leq z\leq0.1$, and M2 comprising one or more (elements selected) from the group consisting of Sr and Ba.

Hence, in a specific embodiment, the luminescent particles comprise a luminescent material selected from (the) $SrLiAl_3N_4$:Eu$^{2+}$ (class). The term "class" herein especially refers to a group of materials that have the same crystallographic structure(s). Further, the term "class" may also include partial substitutions of cations and/or anions. For instance, in some of the above-mentioned classes Al—O may partially be replaced by Si—N (or the other way around). The class of $SrLiAl_3N_4$:Eu$^{2+}$ may especially relate to a group of materials that have the same crystallographic structure, especially wherein Sr is partially replaced by divalent Eu, e.g. by 0.1% or 2%. For instance $Sr_{0.995}LiAl_3N_4$:Eu$_{0.005}$ and $Sr_{0.98}LiAl_3N_4$:Eu$_{0.02}$ are elements of such class. Likewise the $SrLi_2Al_{1.995}Si_{0.005}O_{1.995}N_{2.005}$:Eu$^{2+}$ class (see also below) may e.g. comprise $Sr_{0.999}Li_2Al_{1.995}Si_{0.005}O_{1.995}N_{2.005}$:Eu$_{0.001}$ and $Sr_{0.955}Li_2Al_{1.995}Si_{0.005}O_{1.995}N_{2.005}$:Eu$_{0.015}$. Optionally also part of Sr may be replaced by another alkaline earth metal (group 2 elements of the periodic table). Examples of the $SrLiAl_3N_4$:Eu$^{2+}$ class are provided above. However, other luminescent materials may thus also be possible.

In further embodiments, the luminescent material (or phosphor) is selected from a group consisting of (Sr,Ca)LiAl₃N₄:Eu, (Sr,Ca,Ba)Li$_a$Mg$_b$Al$_b$N₄:Eu, with 0≤a≤4; 0≤b≤4; 0≤d≤4; and a+b+d=4 and 2a+3b+d=10, and (Sr,Ba)Li$_2$Al$_{2-z}$Si$_z$O$_{2-z}$N$_{2+z}$:Eu, wherein 0≤z≤0.1.

The luminescent core may thus especially comprise a phosphor. Moreover, the luminescent core especially comprises a luminescent material described herein, especially in relation to the phosphor. The method may be applied for providing more than one, especially a plurality of luminescent particles with a hybrid coating (and especially coating more than one luminescent core).

In further embodiments of the luminescent material, the luminescent core, comprises a (phosphor) material selected from a group consisting of (i) (the) SrLiAl₃N₄:Eu²⁺ (class), especially wherein an (Eu) doping concentration is in the range of 0.1-5%, especially 0.1-2%, even more especially 0.2-1.2%, relative to Sr, and (ii) (the) SrLi$_2$Al$_{1.995}$Si$_{0.005}$O$_{1.995}$N$_{2.005}$:Eu²⁺ (class), especially wherein the Eu doping concentration is in the range of 0.1-5%, especially 0.1-2%, even more especially 0.2-1.5 at. % relative to Sr. Further, especially, the third coating layer comprises SiO₂, and one or more layers of the multilayer comprise one or more of Ta₂O₅, HfO₂, TiO₂ and ZrO₂ and wherein one or more (other) layers of the multilayer comprise Al₂O₃, especially herein the layer contacting the main sol-gel coating layer consist of one or more metal oxides selected from a group of HfO₂, ZrO₂, TiO₂, Ta₂O₅.

Such luminescent particles may have a number averaged particle size in the range of 0.1-50 μm, such as in the range of 0.5-40 μm, such as especially in the range of 0.5-20 μm. Hence, the luminescent core may have dimensions such as at maximum about 500 μm, such as at maximum 100 μm, like at maximum about 50 μm. especially with the larger particle sizes, substantially only individual particles may be coated, leading thus to luminescent core dimensions in the order of 50 μm or smaller. Hence, the invention is directed to the coating of particles. The dimensions of the luminescent core may substantially be smaller when nanoparticles or quantum dots are used as basis for the particulate luminescent material. In such instance, the cores may be smaller than about 1 μm or substantially smaller (see also below for the dimensions of the QDs).

Alternatively or additionally, the luminescent particle(s), especially the luminescent core(s), include luminescent quantum dots. The term "quantum dot" or "luminescent quantum dot" may in embodiments also refer to a combination of different type of quantum dots, i.e. quantum dots that have different spectral properties. The QDs are herein also indicated as "wavelength converter nanoparticles" or "luminescent nanoparticles". The term "quantum dots" especially refer to quantum dots that luminesce in one or more of the UV, visible and IR (upon excitation with suitable radiation, such as UV radiation). The quantum dots or luminescent nanoparticles, which are herein indicated as wavelength converter nanoparticles, may for instance comprise group II-VI compound semiconductor quantum dots selected from a group consisting of (core-shell quantum dots, with the core selected from a group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from a group consisting of (core-shell quantum dots, with the core selected from a group consisting of) GaN, GaP, GaAs, AlN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from a group consisting of (core-shell quantum dots, with the core selected from a group consisting of) CuInS₂, CuInSe₂, CuGaS₂, CuGaSe₂, AgInS₂, AgInSe₂, AgGaS₂, and AgGaSe₂. In yet a further embodiment, the luminescent nanoparticles may for instance be (core-shell quantum dots, with the core selected from a group consisting of) I-V-VI2 semiconductor quantum dots, such as selected from a group consisting of (core-shell quantum dots, with the core selected from a group consisting of) LiAsSe₂, NaAsSe₂ and KAsSe₂. In yet a further embodiment, the luminescent nanoparticles may for instance be core-shell quantum dots, with the core selected from a group consisting of) group (IV-VI compound semiconductor nano crystals such as SbTe. In a specific embodiment, the luminescent nanoparticles are selected from a group consisting of (core-shell quantum dots, with the core selected from a group consisting of) InP, CuInS₂, CuInSe₂, CdTe, CdSe, CdSeTe, AgInS₂ and AgInSe₂. In yet a further embodiment, the luminescent nanoparticles may for instance be one of the group (of core-shell quantum dots, with the core selected from a group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn. The luminescent core may comprise one or more, especially more, (of the same or different) (types of) luminescent nanoparticles.

It appears to be especially advantageous to use II-VI quantum dots. Hence, in embodiments the semiconductor based luminescent quantum dots comprise II-VI quantum dots, especially selected from a group consisting of (core-shell quantum dots, with the core selected from a group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from a group consisting of CdS, CdSe, CdSe/CdS and CdSe/CdS/ZnS.

In embodiments, the wavelength converter nanoparticles have an average particle size in a range of about 1 to about 1000 nanometers (nm), and preferably in a range of about 1 to about 100 nm. In embodiments, nanoparticles have an average particle size in a range of about 1 to about 20 nm. In embodiments, nanoparticles have an average particle size in a range of about 1 to about 10 nm. The luminescent nanoparticles (without coating) may have dimensions in the range of about 2-50 nm, such as 2-20 nm, especially 2-10 nm, even more especially 2-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 2-5 nm). The term "dimensions" especially relate to one or more of length, width, and diameter, dependent upon the shape of the nanoparticle. Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or CuInSe$_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in embodiments the semiconductor based luminescent quantum dots comprise core-shell quantum dots. In yet further embodiments, the semiconductor based luminescent quantum dots comprise dots-in-rods nanoparticles. A combination of different types of particles may also be applied. Here, the term "different types" may relate to different geometries as well as to different types of semiconductor luminescent material. Hence, a combination of two or more of (the above indicated) quantum dots or luminescent nanoparticles may also be applied.

In embodiments, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from a group consisting of" is applied in some of the above lists of quantum dot materials. The term "core-shell" may also refer to "core-shell-shell", etc., including gradient alloy shell, or dots in rods, etc.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group 1-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In embodiments, more than one overcoating can be included on a core.

In embodiments, the surrounding "shell" material can have a band gap greater than the band gap of the core material. In certain other embodiments, the surrounding shell material can have a band gap less than the band gap of the core material. In embodiments, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific wavelength converter nanoparticles, based on semiconductors.

Therefore, in embodiments the luminescent particle or the luminescent core comprises a luminescent material selected from a group consisting of luminescent quantum dots comprising one or more core materials selected from a group consisting of CdS, CdSe, ZnS, and ZnSe. Hence, in embodiments the luminescent particle or luminescent core may also be selected from a group of luminescent nanoparticles such as quantum dots or quantum rods of composition MX (M=Cd, Zn, X=Se, S). Such particles may have a number averaged particle size (i.e. especially length/width/height, diameter), in the range of 1-50 nm.

As discussed above, the luminescent particle especially comprises a main ALD coating layer configured at the primer layer. In embodiments, the luminescent particle may further comprise a further ALD coating layer configured at (onto) the main sol-gel coating layers. The main ALD coating layer may be deposited by application of the main atomic layer deposition process ("main ALD process"). The further ALD coating layer may be deposited by application of the further atomic layer deposition process ("further ALD process"). The main atomic layer deposition process as well as the (optional) further atomic layer deposition process both are an atomic layer deposition process ("ALD process"). It will be understood that these processes may comprise the same ALD process. Yet, e.g., the conditions of the main ALD process may differ from the conditions of the further ALD process. For instance, the metal oxide precursor(s) used in the main ALD process may differ from the one(s) used in the further ALD process. The duration of the deposition may differ, the temperature may differ, etc. Yet especially the metal oxide precursor(s) that may be applied in the further ALD process may be the metal oxide precursor(s) described in relation to the (main) ALD process (and vice versa).

Hence, the main ALD coating layer and the optional further ALD coating layer may be formed by an atomic layer deposition type process. In such process a polymeric network is formed by reaction of a metal oxide precursor with an oxygen source such as water and/or ozone in the gas phase. The ALD reaction is "splitted" in (at least) two parts. In a first step the metal (oxide) precursor is fed into a(n ALD) reactor and adsorbs and/or reacts with reactive groups on the particle surfaces and substantially all non-reacted or non-adsorbed precursor molecules are removed by reactor purging. In a second step the oxygen source is fed into the reactor and reacts with the metal source on the particle surfaces followed by purging of the reactor to remove substantially all remaining oxygen source molecules and hydrolysis products formed by condensation reactions. The two steps lead to formation of an atomic layer (or monolayer) because of the self-limiting nature of the surface reaction. These atomic layer reaction steps may be repeated multiple times to form the final ALD coating. The ALD process further allows it to deposit layers of different composition by consecutively feeding different metal oxide precursor into the reactor to form multicomponent layers or nanolaminates with tailored chemical, mechanical, and optical properties (see further below).

The term "metal oxide precursor" especially indicates a precursor of the metal oxide. The precursor itself may not be a metal oxide but may e.g. include metal organic molecule. Hence, especially the metal (oxide) precursors for ALD may typically include metal halides, alkoxides, amides, and other metal (organic) compounds. The term metal oxide precursor may relate to more than one different metal oxide precursor, especially for more than one different metal oxides The step by step nature of the ALD process allows to easily deposit defined layer thicknesses. The ALD process further allows it to deposit layers of different composition by consecutively feeding different metal oxide precursors into the reactor to form multicomponent layers or nanolaminates. Hence, in a specific embodiment the main ALD coating layer (and/or the further ALD coating layer) comprises a multilayer (or a nanolaminate) (see also below).

For the ALD process, amongst others a fluidized bed reactor may be applied.

Hence, in a specific embodiment the main ALD coating layer is provided by application of the (main) atomic layer deposition process. Further, in embodiments, the further ALD coating layer (also) is provided by application of the (further) ALD process. In embodiments, a static powder bed is used for ALD coating of the primer layer and/or for ALD coating of the main sol-gel coating. However, also a fluidized bed may be applied (for one or more of the ALD processes). Other type of reactors may also be applied. As is described above, the primer layer may facilitate deposition of the main ALD coating layer especially by functioning as a nucleation layer or a seed layer for the main ALD coating layer. Especially, reactive groups on the particle surface may be provided by the primer layer (and also by the main sol-gel coating layer).

For instance, silanol groups (assuming a primary and/or main silica sol-gel coating layer) at the surface of the sol-gel coating layer act as reactive sites during ALD of the initial layers. In an embodiment, alumina is deposited by using Al(CH$_3$)$_3$ (TMA) as metal oxide precursor and (subsequently exposure to) water as the oxygen source. In the first reaction step, TMA reacts with surface silanol groups of the silica sol-gel coating layer according to:

≡Si—OH+Al(CH$_3$)$_3$→≡Si—O—Al(CH$_3$)$_2$+CH$_4$

Water then reacts in the second reaction step with the metal oxide precursor by hydrolysis followed by condensation reactions:

≡Si—O—Al(CH$_3$)$_2$+2H$_2$O→≡Si—O—Al(OH)$_2$+ 2CH$_4$

2≡Si—O—Al(OH)$_2$→≡Si—O—Al(OH)—O—Al (OH)—O—Si≡+H$_2$O

Further, particle agglomeration may substantially be prevented by applying the primer sol-gel layer (and the main sol-gel coating layer) with a structured, nano-porous surface, such as of the silica sol-gel coating layer (see below).

The ALD process can easily be scaled up and nearly no powder or particle loss during ALD coating is observed. Commercially available ALD reactors for powder coating are e.g. sold by Picosun Oy with e.g. a cartridge sample holder (POCA™). A system that may be used for the ALD process is e.g. described in WO 2013171360 A1, though other systems may also be applied.

A (non-limited) number of suitable materials for the ALD coating layer are listed in the following table:

| Oxide material | Metal (oxide) precursor | Oxygen source | Deposition T [° C.] |
|---|---|---|---|
| Al$_2$O$_3$ | Al(CH$_3$)$_3$ (TMA) or HAl(CH$_3$)$_2$ | H$_2$O or O$_3$ | 100-400 |
| HfO$_2$ | Hf(N(CH$_3$)$_2$)$_4$ or Hf(N(CH$_2$CH$_3$)$_2$)$_4$ | H$_2$O | 80-300 |
| Ta$_2$O$_5$ | TaCl$_5$ or Ta(N(CH$_3$)$_2$)$_5$ | H$_2$O | 80-300 |
| ZrO$_2$ | ZrCl$_4$ or Zr(N(CH$_3$)$_2$)$_4$ | H$_2$O | 80-300 |
| TiO$_2$ | TiCl$_4$, Ti(OCH$_3$)$_4$ or Ti(OEt)$_4$ | H$_2$O | 80-300 |
| SiO$_2$ | SiCl$_4$, H$_2$N(CH$_2$)$_3$Si(OEt)$_3$ or Si(OEt)$_4$ | H$_2$O or O$_3$ | 150-300 |

Alternatively or additionally, niobium oxide (especially Nb$_2$O$_5$) or yttrium oxide (Y$_2$O$_3$) may be applied. Metal precursors thereof are e.g., (tert-butylimido)-tris (diethylamino)-niobium, NbF$_5$, or NbCl$_5$, and Tris(ethylcyclopentadienyl) Yttrium, respectively. In further embodiments zinc oxide (ZnO) may be applied. Metal precursors thereof that e.g. may be applied are diethylzinc (DEZ), Zn(C$_2$H$_5$)$_2$ and dimethylzinc (DMZ) Zn(CH$_3$)$_2$. However, other materials may also be applied. Hence, in the atomic layer deposition process a metal oxide precursor may especially be selected from a group of metal oxide precursors of metals comprising Al, Zn, Hf, Ta, Zr, Ti, and Sn (and optionally Si). Alternatively or additionally, metal precursors of one or more metals comprising Ga, Ge, V and Nb may be applied. Even more especially, alternating layers of two or more of these precursors are applied, wherein at least one precursor is an Al metal oxide precursor, and another precursor is selected from a group consisting of a Hf metal oxide precursor, a Zn metal oxide precursor, a Ta metal oxide precursor, a Zr metal oxide precursor, a Ti metal oxide precursor, and a Sn metal oxide precursor, especially selected from a group consisting of a Hf metal oxide precursor, a Ta metal oxide precursor, a Ti metal oxide precursor, and a Zr metal oxide precursor, such as selected from a group consisting of a Hf metal oxide precursor, a Ta metal oxide precursor, and a Zr metal oxide precursor, even more especially a Ta metal oxide precursor. Especially Hf, Zr, and Ta appear to provide relatively light transmissive layers, whereas Ti, for instance, may provide relatively less light transmissive layers. Using TiCl$_4$ as the metal oxide precursor (for a TiO$_2$ layer) may provide a cost efficient layer. Processing with Ta, Hf and Zr seems to be relatively easier than Si, for instance. The terms "oxide precursor" or "metal oxide precursor" or "metal (oxide) precursor" may also refer to a combination of two or more chemically different precursors. These precursors especially form an oxide upon reaction with the oxygen source (and are therefore indicated as metal oxide precursor). The metal oxide precursors may in embodiments be selected independently from each other for successive ALD cycles. For instance, in embodiments, a ZnO layer and an $Al_2O_3$ layer are deposited alternately to obtain an AZO layer ($Al_2O_3$: ZnO, or "aluminum-doped zinc oxide layer"). The AZO layer may be a conductive layer and may be deposited using. e.g., trimethylaluminum, diethylzinc, and water as an oxygen source. In further embodiments, a (another) metal oxide is (also) deposited in multiple consecutive cycles (and optionally successively a further metal oxide is deposited (optionally also in multiple consecutive cycles).

Further, the term "metal oxide precursors of metals comprising Al, Zn, Hf, Ta, Zr, Ti, and Sn" and comparable terms in phrases like "in the atomic layer deposition process a metal oxide precursor is selected from a group of metal oxide precursors of metals comprising Al, Zn, Hf, Ta, Zr, Ti, and Sn" especially refers to metal oxide precursors of metals selected from a group consisting of the given metals (in this respect Al, Zn, Hf, Ta, Zr, Ti, Sn). Furthermore, in embodiments one or more metal oxides precursors are selected. For instance, with reference to the list given above, the metal oxide precursor "that is selected from the group of metal oxide precursors of metals comprising Al, Zn, Hf, Ta, Zr, Ti, and Sn" may comprise any combination of metal oxide precursors of two or more metals selected from the group consisting of Al, Zn, Hf, Ta, Zr, Ti, and Sn. In embodiments, e.g. the metal oxide precursor comprises a combination of $TaCl_5$ and $HAl(CH_3)_2$. In further embodiments, the metal oxide precursor comprises only $Al(CH_3)_3$.

Hence, in embodiments, in the main atomic layer deposition process a metal oxide precursor is selected from a group of metal oxide precursors of metals selected from a group consisting of Al, Zn, Hf, Ta, Zr, Ti, Sn, Nb, Y, Ga, and V (and optionally Si). Especially, in further embodiments, in the main atomic layer deposition process the metal oxide precursor is selected from a group of metal oxide precursors of metals comprising Al, Hf, Ta, Zr, and Ti (especially metal oxide precursors of metals selected from a group consisting of Al, Hf, Ta, Zr, and Ti). In further embodiments, in the main atomic layer deposition process a metal oxide precursor selected from a group consisting of $Al(CH_3)_3$, $HAl(CH_3)_2$, $Hf(N(CH_3)_2)_4$, $Hf(N(CH_2CH_3)_2)_4$, $Hf[N(CH_3)(CH_2CH_3)]4$, $TaCl_5$, $Ta(N(CH_3)_2)_5$, $Ta\{[N(CH_3)(CH_2CH_3)]3N(C(CH_3)_3)\}$, $ZrCl_4$, $Zr(N(CH_3)_2)_4$, $TiCl_4$, $Ti(OCH_3)_4$, and $Ti(OCH_2CH_3)_4$ and an oxygen source selected from a group consisting of $H_2O$ and $O_3$ are applied. Additionally or alternatively, in the (main) atomic layer deposition process a metal oxide precursor is selected from a group consisting of $Zn(C_2H_5)_2$ and $Zn(CH_3)_2$. In yet further embodiments, additionally or alternatively, in the (main) atomic layer deposition process, the metal precursor is selected from a group consisting of (tert-butylimido)-tris (diethylamino)-niobium, $NbF_5$, $NbCl_5$, and Tris(ethylcyclopentadienyl)Yttrium.

The metal oxide precursor(s) in the further atomic layer deposition process is especially independently selected from the metal oxide precursor(s) in the main atomic layer deposition process and may especially (also) be selected from a group of metal oxide precursors of metals selected from a group consisting of Al, Zn, Hf, Ta, Zr, Ti, Sn, Nb, Y, Ga, and V (and optionally Si). In embodiments, (at least one of) the metal oxide precursor(s) in the further atomic layer deposition process is a Si metal oxide precursor. Especially, in further embodiments, in the further atomic layer deposition process the metal oxide precursor is selected from a group of metal oxide precursors of metals selected from a group consisting of Al, Hf, Ta, Zr, and Ti. In embodiments, in the further atomic layer deposition process a metal oxide precursor is (also independently from the main ALD process) selected from a group consisting of $Al(CH_3)_3$, $HAl(CH_3)_2$, $Hf(N(CH_3)_2)_4$, $Hf(N(CH_2CH_3)_2)_4$, $Hf[N(CH_3)(CH_2CH_3)]4$, $TaCl_5$, $Ta(N(CH_3)_2)_5$, $Ta\{[N(CH_3)(CH_2CH_3)]3N(C(CH_3)_3)\}$, $ZrCl_4$, $Zr(N(CH_3)_2)_4$, $TiCl_4$, $Ti(OCH_3)_4$, and $Ti(OCH_2CH_3)_4$, and an oxygen source selected from a group consisting of $H_2O$ and $O_3$ are applied. Additionally or alternatively, in the further atomic layer deposition process, a metal oxide precursor is selected from a group consisting of $Zn(C_2H_5)_2$ and $Zn(CH_3)_2$. In yet further embodiments, additionally or alternatively, in the further atomic layer deposition process the metal precursor is selected from a group consisting of (tert-butylimido)-tris (diethylamino)-niobium, $NbF_5$, $NbCl_5$, and Tris(ethylcyclopentadienyl)Yttrium.

Especially, in embodiments, in the main atomic layer deposition process and/or in the further atomic layer deposition process, a metal oxide precursor is selected from a group of metal oxide precursors of metals selected from a group consisting of Al, Zn, Hf, Ta, Zr, Ti, Si, Sn, Nb, Y, Ga, and V.

It turned out that deposition temperatures in the 200-350° C. range are most suitable for alumina ALD on the primer layer (and the main sol-gel coating layer), preferably the temperature is in the 250-300° C. range. Similar temperatures may be applied for ALD of other metal oxide precursors for the ALD layer(s).

In specific embodiments, the main ALD coating layer comprises a multilayer with at least three layers having different chemical compositions and one or more of the layers comprise an oxide of Si ($SiO_2$). Especially, such $SiO_2$ layer is sandwiched between other layers of the multilayer. Hence, especially the (ALD) layer (of the multilayer of the main ALD coating layer) contacting the main sol-gel layer and the respective (ALD) layer contacting the primer layer does not consist of $SiO_2$. Yet, in embodiments a further ALD coating layer contacting the main sol-gel coating layer may comprise $SiO_2$. Hence, in embodiments, in the (main and/or further) atomic layer deposition process a metal oxide precursor of Si is selected.

Especially, the main ALD alumina (or other metal oxide) layer has a thickness of 3-250 nm, especially a thickness of as 5-250 nm, such as 5-100 nm, even more especially a thickness of 5-50 nm, such as especially 10-50 nm, even more especially a thickness of 20-50 nm.

Water gas penetration barrier properties of alumina ALD layers can be further improved by depositing at least one additional layer of a different oxide material such as $ZrO_2$, $TiO_2$, $Y_2O_3$, $Nb_2O_5$, $HfO_2$, $Ta_2O_5$. Especially, the thickness of the additional material layer is in the range 1-40 nm, more preferably in the range 1-10 nm. Even more especially are nanolaminate stacks of alternating layers of $Al_2O_3$ and a second oxide material from the group of $ZrO_2$, $TiO_2$, $Y_2O_3$, $Nb_2O_5$, $HfO_2$, $SnO_2$ $Ta_2O_5$. A suitable nanolaminate stack may be e.g. 20×(1 nm $Al_2O_3$ (10 ALD cycles)+1 nm $ZrO_2$ (11 ALD cycles)) deposited at 250° C. to form a 40 nm thick nanolaminated $2^{nd}$ coating on the primer layer (and/or the main sol-gel coating layer).

The invention especially provides in embodiments a method wherein the main ALD coating layer comprises a multilayer with layers having different chemical compositions, and wherein in the atomic layer deposition process a metal oxide precursor is—amongst others—selected from a group of metal oxide precursors of metals selected from a group consisting of Al, Zn, Hf, Ta, Zr, Ti, Sn, Y, Ga, Ge, V and Nb (and optionally Si), especially the metal oxide precursor is selected from a group of metal oxide precursors of metals selected from a group consisting of Al, Hf, Ta, Zr, and Ti. Also combinations of two or more of such precursors may be used, e.g. a multilayer comprising alumina—a mixed oxide of zirconium and hafnium-alumina, etc. In specific embodiments, in the main atomic layer deposition process, the metal oxide precursor for the two or more layers is selected from a group of metal oxide precursors of metals selected from a group consisting of Al, Hf, Ta, Zr, and Ti.

Hence, in embodiments the main ALD coating layer may comprise a multilayer with (n) layers having different chemical compositions, and wherein the multilayer comprises one or more layers comprising an oxide of one or more of Al, Zn, Hf, Ta, Zr, Ti, Sn, Y, Ga, Ge, V, and Nb (and optionally Si), especially wherein the multilayer comprises one or more layers comprising an oxide of one or more of Al, Hf, Ta, Zr, and Ti. One or more layers of such multilayers may also include mixed oxides, such as indicated above.

In further specific embodiments, the method of the invention comprises successively providing n layers (onto the primer layer by application of the main atomic layer deposition process), especially wherein each layer has a layer coating layer thickness (d21) in the range of 1-50 nm, especially 1-20 nm, such as 1-15 nm. The layer coating thickness may in embodiments be at least 2 nm, such as at least 5 nm and e.g. be in the range of 5-40 nm, especially 5-25 nm. The number n of layers is especially at least 2, such as at least 3, or at least 4. In embodiments, n may be larger than 10. Yet, n is especially equal to or smaller than 10, such as equal to or smaller than 5. In embodiments, $2 \leq n \leq 10$, or especially $2 \leq n \leq 5$. It will be understood that an individual layer may be provided by one or more ALD cycles. Further, especially adjacent (contacting) layers comprise different chemical compositions. In further embodiments, one or more layers comprise one or more metal oxides selected from a group of $HfO_2$, $ZrO_2$, $TiO_2$, $Ta_2O_5$, especially wherein one or more (other) layers comprise $Al_2O_3$. It further appeared to be advantageous when the layer contacting the main sol-gel coating layer consist of $HfO_2$ and/or $ZrO_2$ and/or $TiO_2$ and/or $Ta_2O_5$. Hence, in further embodiments, a layer contacting the main sol-gel coating layer consist of one or more metal oxides selected from the group of $HfO_2$, $ZrO_2$, $TiO_2$, $Ta_2O_5$.

Hence, in specific embodiments, the method comprises successively providing n (ALD) layers onto the primer layer by application of the main atomic layer deposition process (to provide the multilayer), wherein each layer has a layer coating layer thickness (d21) in the range of 1-50 nm, especially 1-20 nm, such as 1-15 nm, and wherein $2 < n \leq 50$, especially $2 < n \leq 20$, such as $2 \leq n \leq 10$, especially $2 \leq n \leq 5$, wherein one or more layers comprise one or more metal oxides selected from a group of $HfO_2$, $ZrO_2$, $TiO_2$, $Ta_2O_5$, and wherein one or more layers comprise $Al_2O_3$, wherein a layer contacting the main sol-gel coating layer consist of one or more metal oxides selected from the group of $HfO_2$, $ZrO_2$, $TiO_2$, $Ta_2O_5$.

Especially the method is applied such that a (n ALD) multilayer coating (especially for the main ALD coating layer) is obtained including at least two (ALD) layers ("AB"), even more especially at least three layers (e.g. "ABA"), yet even more at least four layers. Yet more especially, at least a stack comprising two or more stack of subsets of two (ALD) layers ("AB") is applied, such as $(AB)_n$, wherein n is 2 or more, such as 2-20, like 2-10.

Especially, at least one of the layers of the multilayer comprises an oxide of Al(optionally in combination with a further oxide of e.g. Si, or another metal oxide described herein), and at least one of the layers of the multilayer comprises one or more of an oxide of Hf, Zn, Ta, Zr, Ti, Y, Ga, Ge, V, Sn, and Nb. Such layer may optionally also include Al, Zn, Hf, Ta, Zr, Ti, Sn(Si,) Y, Ga, Ge, V, and Nb, wherein Al is in a layer together with one or more of the other indicated elements, when the other layer(s) of the multilayer comprise an oxide of alumina, respectively. The term "ALD multilayer" or "multilayer" as indicated above especially refers to layers having different chemical compositions. The phrase "layers having different chemical compositions" indicates that there are at least two layers having different chemical compositions, such as in the case of "ABC", or in the case of $(AB)_n$ (with $n \geq 1$).

Specific examples of $(AB)_1$ include multilayers wherein A is an oxide of Al and wherein B is selected from one or more of an oxide of Al, Zn, Hf, Ta, Zr, Ti, Sn, Y, Ga, Ge, V, and Nb, wherein Al (and/or optionally Si) is in a layer together with one or more of the other indicated elements, when the other layer(s) of the multilayer comprise an oxide of alumina, respectively, especially wherein B is selected from one or more of an oxide of Hf, Zn, Ta, Zr, Ti, Y, Ga, Ge, V, and Nb, yet even more especially wherein B is selected from one or more of an oxide of Hf, Ta, Zr, and Ti, more especially wherein B is selected from one or more of an oxide of Hf, Ta, and Zr. In embodiments, B may further comprise an oxide of Si (optionally in combination with one or more of the oxides of Al, Zn, Hf, Ta, Zr, Ti, Sn, Y, Ga, Ge, V, and Nb). Especially, if (also) a $SiO_2$ layer is deposited with ALD, the $SiO_2$ (ALD) layer is deposited such that it not directly contacts the main sol-gel layer. For instance, the A layer (or B layer) of a multilayer may be an $SiO_2$ layer and the B layer (or A layer) contacting the main sol-gel layer may be an (ALD) layer having another chemical composition.

This main ALD multilayer is thus especially provided on the primer layer. The main sol-gel layer is especially provided on the main ALD multilayer. Further, as indicated above, on top of the main sol-gel layer, optionally one or more further layers may be applied, especially a further ALD layer may be provided on top of the main sol-gel layer. The further ALD layer may comprise an ALD multilayer, for instance an ALD multilayer as described herein in relation to the main ALD multilayer.

In further specific embodiments, the method further comprises (iv) providing a further ALD coating layer onto the luminescent core with the main sol-gel coating by application of a further atomic layer deposition process. Especially, thereby a further ALD coated luminescent particle is provided. In the further atomic layer deposition process especially a metal oxide precursor is selected from a group of metal oxide precursors comprising Al, Zn, Hf, Ta, Zr, Ti, Sn, Nb, Y, Ga, and V (and optionally Si), especially comprising Al, Hf, Ta, Zr, Ti. In embodiments, the further ALD coating layer has a further ALD coating layer thickness (d4) in the range of 2-50 nm, especially 10-50 nm, such as 10-20 nm. The further ALD coating layer especially has a chemical composition differing from the chemical composition of the main sol-gel coating layer.

In further embodiments, the further ALD coating layer (optionally) comprises (is provided comprising) a further multilayer with two or more (further sub) layers having different chemical compositions, wherein one or more of the layers comprise metal oxides selected from a group of $Al_2O_3$, $TiO_2$, $ZrO_2$, $HfO_2$, $SnO_2$, $ZnO$ and $Ta_2O_5$, and wherein the two or more layers have a chemical composition differing from the chemical composition of the main sol-gel coating layer. In specific embodiments, in the further atomic layer deposition process, the metal oxide precursor for the two or more (further sub) layers (of the further multilayer) is selected from a group of metal oxide precursors of metals selected from a group consisting of Al, Hf, Ta, Zr, and Ti. The metal oxide precursor for the two or more (further sub) layers (of the further multilayer) is especially selected from a group of metal oxide precursors comprising Al, Hf, Ta, Zr, Ti.

Hence, in specific embodiments the main ALD coating layer comprises a multilayer with a stack of layers, with adjacent layers having different chemical compositions. Especially, the layers of the multilayer have each independently thicknesses in the range of 1-40 nm, especially 1-10 nm. Further, especially, the multilayer comprises one or more alumina layers and one or more metal oxide layers, with the metal selected from a group of Hf, Ta, Zr and Ti.

Therefore, in specific embodiments in the atomic layer deposition process a metal oxide precursor selected from a group consisting of $Al(CH_3)_3$, $HAl(CH_3)_2$, $Hf(N(CH_3)_2)_4$, $Hf(N(CH_2CH_3)_2)_4$, $Hf[N(CH_3)(CH_2CH_3)]4$, $TaCl_5$, $Ta(N(CH_3)_2)_5$, $Ta\{[N(CH_3)(CH_2CH_3)]3N(C(CH_3)_3)\}$, $ZrCl_4$, $Zr(N(CH_3)_2)_4$, $TiCl_4$, $Ti(OCH_3)_4$, and $Ti(OCH_2CH_3)_4$, and an oxygen source selected from a group consisting of $H_2O$ and O3 are applied. As indicated above, also two or more different metal oxide precursors and/or two or more different oxygen sources may be applied.

Further, in embodiments of the method in the main atomic layer deposition process and/or the further atomic layer deposition process, especially in the main atomic layer deposition process, a multilayer is provided, with layers having different chemical compositions, wherein one or more layers comprise tantalum oxide (especially $Ta_2O_5$). Hence, the invention also provides in embodiments luminescent material, wherein the main ALD coating layer comprises a multilayer with layers having different chemical compositions, wherein one or more layers may especially comprise $Ta_2O_5$. Further, in embodiments of the method in the (main) atomic layer deposition process, a multilayer is provided, with layers having different chemical compositions, wherein one or more layers comprise one or more of tantalum oxide (especially $Ta_2O_5$), hafnium oxide, titanium oxide, and zirconium oxide. Hence, the invention also provides in embodiments luminescent material, especially luminescent particles, wherein the main ALD coating layer comprises a multilayer with layers having different chemical compositions, wherein one or more layers may especially comprise one or more of tantalum oxide, hafnium oxide, titanium oxide and zirconium oxide. For instance, the multilayer stack may also include a stack with alternating layers wherein e.g. alumina alternates with one or more of tantalum oxide (especially $Ta_2O_5$), hafnium oxide, titanium oxide, and zirconium oxide, such as a stack comprising e.g. alumina-tantalum oxide-alumina-Hafnia-alumina-tantalum oxide, or alumina-titanium oxide-alumina, etc.

Further, it appeared that when first an ALD coating was provided on core without a primer layer the ALD layer was less uniform than desirable. To obtain a good ALD layer directly on the core surface, the ALD layer thickness may in such embodiments have to be increased more than in principle would be necessary, which may lead to an unnecessary reduction in transmission (even though in some cases small). Further, it appeared that after providing the primer layer at the core (even when not being completely conformal), an ALD coating coats more easily to the core.

As indicated above, the main sol-gel layer that typically has an average thickness in the range of 50-700 nm, such as 50-600 nm, especially 75-500 nm, such as especially 100-500 nm, and is formed by a sol-gel type process. In such process, an inorganic network is formed from a homogeneous solution of precursors by subsequent hydrolysis to form a sol (colloidal suspension) and condensation to then form a gel (cross-linked solid network) that is chemically bonded to the powder surfaces. Preferably, the (main) sol-gel coating layer material is silica and the sol-gel deposition method corresponds to the so-called Stöber reaction as described in Stöber, W., A. Fink, et al. "Controlled growth of monodisperse silica spheres in the micron size range." Journal of Colloid and Interface Science 26(1): 62-69. To this end the (coated or uncoated) luminescent particle is dispersed in an alcohol such as an aliphatic alcohol R—OH such as methanol $CH_3OH$, ethanol $C_2H_5OH$ or iso-propanol $C_3H_7OH$ followed by addition of ammonia ($NH_3$ solution in water) and a silicon alkoxide precursor. The silicon alkoxide precursor dissolves in the alcohol+ammonia mixture and starts to hydrolyze. A conformal silica coating is formed on top of the (coated or uncoated) particle surfaces by reaction of the hydrolyzed, yet dissolved sol species with reactive groups of the particle surfaces (e.g. amine or silanol groups) followed by a seeded growth process that consists of hydrolysis, nucleation and condensation reactions steps.

The term "(coated or uncoated) particle surface" in relation to the sol-gel coating process may especially relate to the surface of the particle (luminescent core) and/or the surface of the washing result layer (especially the oxide-containing layer) on the particle (luminescent core), especially in relation to the primary sol-gel coating process. The term may further relate to the surface of the main ALD coating, especially in relation to the main sol-gel coating process.

The silicon alkoxide recursor is especially selected from a group of compounds that is formed by

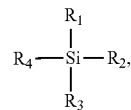

wherein a) R1, R2, R3 are hydrolysable alkoxy groups and R4 is selected from a group of C1-C6 linear alkyl groups, hydrolysable alkoxy groups and a phenyl group, or b) R1, R2, R3 are individually selected from —$OCH_3$ and —$OC_2H_5$ and R4 is selected from —$CH_3$, —$C_2H_5$, —$OCH_3$, —$OC_2H_5$ and a phenyl group. Optionally, the silicon based polymer is obtained from a material from the group of:

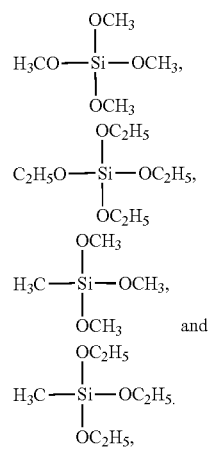

Hence, in embodiments of the method, in the main sol-gel coating process, a silicon alkoxide precursor is used, wherein the silicon alkoxide precursor is especially selected from a group of compounds consisting of

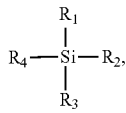

wherein a) R1, R2, R3 are hydrolysable alkoxy groups and R4 is selected from a group of C1-C6 linear alkyl groups, hydrolysable alkoxy groups and a phenyl group, or b) R1, R2, R3 are individually selected from —OCH$_3$ and —OC$_2$H$_5$ and R4 is selected from —CH$_3$, —C$_2$H$_5$, —OCH$_3$, —OC$_2$H$_5$ and a phenyl group.

In further embodiments of the method, in the main sol-gel coating process, a silicon alkoxide precursor is used, and the silicon alkoxide precursor is selected from a group consisting of

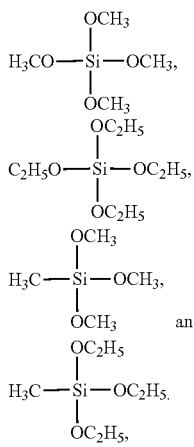

In further embodiments of the method, in the primary sol-gel coating process, a silicon alkoxide precursor is used, and especially the silicon alkoxide precursors may be a silicon alkoxide precursor as described herein in relation to the main sol-gel coating process. The silicon alkoxide precursor in the primary sol-gel coating process may be independently selected from the silicon alkoxide precursor in the main sol-gel coating process.

Especially, the silicon alkoxide precursor (in the main and/or primary sol-gel coating process) is selected from a group of Si(OCH$_3$)$_4$ or Si(OC$_2$H$_5$)$_4$, more especially Si(OC$_2$H$_5$)$_4$ is used as silicon alkoxide precursor. Similar precursors but based on another metal such as e.g. Al may also be used.

A typical sol-gel coating process may comprise the following stages: (a) particles or powder, especially luminescent cores) (optionally with the oxide-containing layer and/or the main ALD coating layer) are suspended in an alcohol-aqueous ammonia solution mixture while stirring or sonication. To improve particle dispersion, the particles (cores/powder) can also first be mixed with alcohol and a small amount of a silicon (or other metal) alkoxide before the ammonia solution is added. (b) A silicon (or other metal) alkoxide precursor is added under agitation of the suspension. Typical concentrations of silicon (or other metal) alkoxide, ammonia and water in the alcohol solvent are 0.02-0.7, 0.3-1.5, and 1-16 mole/l, respectively. (c) The suspension is stirred or sonicated until the coating has formed. (d) The coated powder is washed with alcohol and dried followed by calcination in air or vacuum at 200-300° C.

Hence, in embodiments the main sol-gel coating process comprises: (iiia) providing a mixture of an alcohol, ammonia, water, the luminescent core(s) with the (primer layer and) the main ALD coating layer and a metal alkoxide precursor while agitating the mixture, and allowing a main sol-gel coating layer to be formed on the main ALD coating layer, wherein the metal alkoxide precursor is especially titanium alkoxide, silicon alkoxide, or aluminum alkoxide; and (iiib) retrieving the luminescent core(s) with (the primer layer,) the main ALD coating layer and the main sol-gel coating layer from the mixture and optionally subjecting the retrieved luminescent core(s) with the primer layer, the main ALD coating layer and the main sol-gel coating layer to a heat treatment to provide the luminescent particle(s) with hybrid coating.

Hence, in further embodiments, the primary sol-gel coating process comprises: (ib1) providing a mixture of an alcohol, ammonia, water, the luminescent core(s) optionally with the washing result layer, especially the luminescent core(s) and the washing result layer (or the luminescent core(s) comprising the washing result layer) and a metal alkoxide precursor while agitating the mixture, and allowing the primary sol-gel coating layer to be formed on the washing result layer and/or on the luminescent core(s) without a washing result layer, especially on the washing result layer, wherein the metal alkoxide precursor is especially selected from titanium alkoxide, silicon alkoxide, or aluminum alkoxide; and (ib2) retrieving the luminescent core(s) with the (washing result layer and the) primary sol-gel coating layer from the mixture and optionally subjecting the retrieved luminescent core(s) with (the washing result layer and) the primary sol-gel coating layer to a heat treatment to provide the luminescent core(s) comprising (with) the primer layer on the luminescent core.

The process of retrieving the core(s) (with the respective (coating) layers) from the mixture may e.g. include one or more of filtration, centrifuging, decanting (the liquid over a precipitate), etc. The heat treatment may include one or more of drying and calcination, especially both, i.e. e.g. a drying stage at a temperature in the range of 70-130° C. followed by a calcination stage (in air; or vacuum or an (other) inert atmosphere). Hence, during part of the time of the heat treatment, the (coated) luminescent may be in an inert environment, such as vacuum, or one or more of N$_2$ and a noble gas, etc. The heat treatment seems to improve the stability of the luminescent material. Further, as indicated above, in the (main and/or primary) sol-gel coating process a silicon (or other metal; though the formula below refers to Si) alkoxide especially a precursor may be used selected from a group of compounds consisting of:

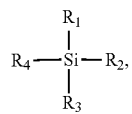

wherein R1, R2, R3 are selected from a group consisting of hydrolysable alkoxy moieties and R4 is selected from a group consisting of C1-C6 linear alkyl moieties, hydrolysable alkoxy moieties, and a phenyl moiety. Optionally other ligands than alkoxides may be applied in precursor for the sol-gel process.

The particles obtained with a sol-gel coating process may optionally include more than one nucleus. For instance in the case of quantum dots, agglomerates with a (primary and/or main) sol-gel coating may be obtained. Hence, the silica precursor (or other metal oxide precursor) can also coat multiple QDs (especially comprising the main ALD coating layer) with thin single shells to form a coated agglomerate. This may amongst others depend upon the concentration of the quantum dots, etc.

Above, the precursors for the sol-gel coating are especially described in relation to a silicon alkoxide precursor. However, also aluminum (or another metal) alkoxide precursor(s) may be applied. Further, also a combination of two or more chemically different precursors may be applied for providing the sol-gel coating layer or first coating layer.

The term "sol-gel coating process" may also relate to a plurality of sol-gel coating processes. With a plurality of sol-gel coating processes, especially a plurality of main sol-gel coating processes, one may provide a (multi)layer substantially comprising the same composition through the entire layer thickness (when e.g. in the (main) sol-gel coating process each coating stage or step includes depositing substantially the same material), or may provide a multilayer with two or more layers having different compositions, such as a stack of two or more (sol-gel) layers with two or more different compositions, respectively. An example may e.g. be a $SiO_2$—$Al_2O_3$ (sol-gel) multilayer, such as a stack of three or more (sol-gel) layers wherein $SiO_2$ and $Al_2O_3$ alternate (see also above).

To facilitate the deposition of the main ALD coating layer, the luminescent core may comprise the primer layer. In embodiments, the primer layer comprises the primary sol-gel coating layer (optionally including a multilayer), especially provided by the (primary) sol-gel coating process. The primary sol-gel coating layer may facilitate the deposition of a (thin) conformal main ALD coating layer. To further support the deposition of the main ALD coating layer, the surface of the core is in embodiments cleaned before providing the primary sol-gel layer and/or the main ALD coating layer.

To facilitate the main ALD deposition process, and especially to enable the deposition of a single ALD layer or multiple layers with as few defects as possible, any chemically reactive contamination (also known as "second phases") that may be present in the powder (raw product, especially comprising a plurality of luminescent cores) may be removed. Preferably, small particles, typically having a sub-micron dimension, and that may stick to the surface of the phosphor particle (luminescent core) are removed as well before depositing the main ALD coating process. The cleaning of the surface of the core may especially comprise a (chemical) washing process. In embodiments, the core may be washed by applying a washing process, by applying an aqueous liquid. Such aqueous liquid may comprise an acid or a base or may e.g. consist of water (with a neutral pH). Water may e.g. be applied for removing small unwanted particles and part of the second phases. Yet, for removing additional impurities the pH of the aqueous liquid may be changed, e.g. to pH-values of at least 8, especially at least 9, or to pH values below 6, especially below 5. This way, e.g. impurities may be dissolved. In further embodiments, a non-aqueous solvent may be applied, especially for particles (cores) that may be sensitive to water. Hence, especially an aqueous liquid comprising additives (e.g. to change the pH), a non-aqueous solvent, or a combination of these liquids/solvents may be applied. Therefore, the cleaning/washing process may be indicated as a "chemical washing process", especially by applying a washing solvent (including an aqueous liquid).

If the chemical stability of the phosphor (luminescent core) in water, bases, and/or acids is limited, washing procedures with very mild conditions may be applied to remove $2^{nd}$ phases without dissolving (part of) the phosphor particles. This can be achieved by choosing weak instead of strong acids with $pK_a$ values that may be selected depending on the stability of the phosphor and impurity phases (see below). Additionally or alternatively degradation of the phosphor in the washing process may be avoided by first applying a non-aqueous solvent to the luminescent core(s) (phosphors) to provide a suspension (of the luminescent particles/cores) and successively add a weak acid (or base) in such a way that the total amount of water and the acid concentration are sufficient to only dissolve the impurity phases.

A washing solvent having a pH less than 7 is useful for hydrolysis sensitive luminescent materials, as such luminescent materials as disclosed herein react as a base in aqueous media. The acidity of such washing solvent may be low. Specifically, organic acids such as acetic acids diluted in a polar solvent with a low proton concentration, such as aliphatic alcohols, e.g. ethanol or isopropanol, as disclosed above, may be used as the washing solvent. The more sensitive the luminescent material is, the more diluted (i.e., the lower the proton concentration) the washing solvent should be, as the goal of the washing process is to remove basic impurity phases and create a surface at the particulate luminescent material that aids adhesion of the subsequent primer layer without degrading the luminescent material. In general, a washing solvent of Thus, if a person having ordinary skill in the art observes that too much of the luminescent particle material is degrading or dissolving in the washing process, a reduction of the acid concentration, a replacement of the solvent by another solvent with a lower dielectric contant and/or a cooling of the washing suspension may reduce the amount of degradation.

After washing, the number of fine particles in the phosphor powder may be further reduced by sedimentation in non-reactive liquids (typically polar organic solvents, like e.g. water-free ethanol, or other alcohols). In embodiments, ultrasound is applied to the suspension before sedimentation to better detach and disperse fine particles from larger phosphor grains.

As a result of the chemical washing process a thin layer may be formed at the particle (core) surface with a different composition compared to the nominal composition of the luminescent particle (luminescent core). That is, the surface composition of the particulate luminescent particle may differ somewhat from the overall composition of the particulate luminescent material. Especially the thin layer (i.e., surface) may comprise a higher oxygen concentration (content) than the (nominal composition of) the luminescent core. Applying the chemical washing may in embodiments provide a washing result layer onto the luminescent core. The washing process may provide a surface (washing result layer) that aids in the adhesion of the subsequent primer layer. The thin layer/surface may contain, for example, alkaline earth elements (e.g., strontium), aluminum, and oxide when, for example alkaline earth aluminate type hydrolysis sensitive luminescent materials such as those disclosed herein are to be coated. The surface layer may contain elements such as lithium, silicon, europium, carbon and/or hydrogen, depending on the luminescent material. The washing result layer especially comprises an oxide-containing layer. The washing result layer not necessarily is conformally and/or entirely covering the surface of the luminescent core (see also above in relation to the primer layer). The washing result layer may not be a continuous layer and may e.g. comprise a plurality of layer section, each covering only a section of the surface of the luminescent core. The washing result layer may in embodiments be evenly distributed over (the surface of) the luminescent core. The washing result layer may in embodiments cover the core for at least 30%, such as at least 50%, especially at least 75%, such as at least 90%, or especially at least 95% or even more especially at least 99%, of the surface of the core.

Experimentally it was noticed that even by applying a mild washing solvent the washing result layer is observable. Especially, in the case of nitride or oxonitride compounds, the O:N ratio may be higher in the washing result layer. The luminescent core especially comprises nitride or oxonitride compounds. In embodiments, the luminescent material, especially of the luminescent core, comprises a nitride luminescent material (core). In further embodiments, the luminescent material, especially of the luminescent core, (also) comprises an oxonitride luminescent material (core).

Hence, in further embodiments, the method further comprises (ia) providing a washing result layer onto the luminescent core by application of a chemical washing process, especially wherein the washing result layer comprises an oxide-containing layer. In further embodiments, the application of the chemical washing process includes drying the luminescent core(s) after removing the washing solvent. The washing result layer may be provided during the washing of the luminescent core with the washing solvent and/or during drying of the luminescent core. In further embodiments, the primary sol-gel coating is provided after application of the chemical washing process (optionally including the drying of the luminescent core). Application of the chemical washing process may provide a washed luminescent particle comprising the washing result layer onto the luminescent core.

Hence, in further embodiments, the method further comprises providing a primary sol-gel coating layer onto luminescent core and the washing result layer (or onto the luminescent core comprising the washing result layer) by application of a primary sol-gel coating process, thereby providing the primer layer comprising the washing result layer and the primary sol-gel layer, and especially wherein the primer layer has a primer layer thickness (d1) in the range of 0.1-5 nm.

The washing solvent may in embodiments comprise an aqueous solvent. Herein, this (washing with a solvent comprising an aqueous solvent) may also be indicated as a "wet chemical washing process". In embodiments, e.g. the washing solvent comprises a strong acid or a strong base. These terms are known in the art. Examples of strong acids are HCl, HBr, HClO$_4$, HI, HNO$_3$. Examples of strong bases are e.g. NaOH, KOH, CaOH. Yet, in further embodiments, the washing solvent comprises a weak acid or a weak base. Examples of weak acids that may be used are e.g. acetic acid, formic acid, hydrofluoric acid, trichloroacetic acid, citric acid, oxalic acid etc. Examples of weak bases are e.g. ammonia, sodium bicarbonate, alanine, and methylamine.

The weak acid or the weak base may especially be selected having a pK$_a$ value or a pK$_b$ value respectively higher than 3, especially equal to or higher than 4 (in water at room temperature). In embodiments, the washing solvent comprises one or more weak acids selected from a group of acetic acid, formic acid, hydrofluoric acid, trichloroacetic acid, citric acid, oxalic acid. The washing solvent may especially comprise formic acid or acetic acid. In further embodiments, the washing solvent comprises one or more weak based ammonia, sodium bicarbonate, alanine, and methylamine. The washing solvent may especially comprise a combination of a non-aqueous fluid and a weak acid or a weak base. For instance, the washing solvent may in embodiments comprise an alcohol (e.g. propanol, isopropyl alcohol, ethanol, (cyclo) hexanol or any other alcohol with one or more hydroxy groups) and a weak acid, e.g. formic acid and/or acetic acid. Alternatively the washing solvent may in embodiments comprise mixtures of an alcohol and a polyol. In embodiments, e.g. the washing solvent comprises a mixture of ethanol and as triethylene glycol and especially traces as water acting as a dissolution catalyst. Such combination may advantageously be applied for washing luminescent particles (cores) that may easily degrade under the influence of water. The washing solvent may in embodiments comprise less than 50 wt % water (relative to the weight of the washing solvent). The washing solvent may e.g. comprise equal to or less than 40 wt % water, such as equal to or less than 35 wt % water. In embodiments, the washing solvent may comprise no more than 25 wt % water. Especially, the washing solvent (comprising a (weak) base or (weak) acid) comprises at least 5 wt % water, such as at least 10 wt % water. Yet in embodiments, the washing solvent is a non-aqueous washing solvent. Further, the application of weak acids (and weak bases) may have a further benefit in that they may provide a pH buffering function. As such, the pH of the washing solvent may not substantially change if an extra amount of the weak acid (or base) is added to the washing solvent (e.g. if not all impurities are removed by the washing solvent yet). Using weak acids or weak bases may increase the robustness of the wet washing process.

Hence, in further embodiments, the chemical washing process may especially comprise a wet chemical washing process comprising (i) washing the luminescent core by applying a washing solvent (process), wherein the washing solvent comprises an (weak) acid or a (weak) base, especially a (weak) acid, and wherein the washing solvent comprises equal to or less than 50% wt/wt water, especially in the range of 10-35% wt/wt water and optionally (ii) successively subjecting the luminescent core to a drying treatment, thereby providing the luminescent core comprising the washing result layer on(to) the luminescent core.

Especially based on the washing process (optionally including the drying treatment), the oxygen-containing layer may be provided on the luminescent particle.

The different (coating) layers that may be configured at the luminescent core (the primary layer, the main ALD-layer, the main sol-gel coating layer and the further ALD coating layer) are especially light transmitting. This means that at least a portion of the light, which impinges on the respective layers, is transmitted through the respective layer. Thus, the different (coating) layers may be fully or partially transparent or may be translucent. In an embodiment, more than 90% of the (visible) light which impinges on the (coating) layers is transmitted through the (coating) layers. The (coating) layers may be light transmitting because of characteristics of the materials of which the coating layers are made. For example, the coating layer may be made from a material which is transparent, even if the layer is relatively thick. In another embodiment, one or more of the (coating) layers are thin enough such that the respective layer becomes light transmitting while the material of which the layer is manufactured is not transparent or translucent when manufactured in relatively thick layers. The materials described herein are all transmissive for (visible) light or can be made in suitable layer thicknesses that are transmissive for (visible) light.

In a further aspect, the invention also provides a lighting device comprising a light source configured to generate light source radiation, especially one or more of blue and UV, and a wavelength converter comprising the luminescent material as described herein, wherein the wavelength converter is configured to convert at least part of the light source radiation into wavelength converter light (such as one or more of green, yellow, orange and red light). The wavelength converter is especially radiationally coupled to the light source. The term "radiationally coupled" especially means that the light source and the luminescent material are associated with each other so that at least part of the radiation emitted by the light source is received by the luminescent material (and at least partly converted into luminescence). Hence, the luminescent cores of the particles can be excited by the light source radiation providing luminescence of the luminescent material in the core. In embodiments, the wavelength converter comprises a matrix (material) comprising the luminescent material (particles). For instance, the matrix (material) may comprise one or more materials selected from a group consisting of a transmissive organic material support, such as selected from a group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (polydimethylsiloxane), and COC (cyclo olefin copolymer). Alternatively or additionally, the matrix (material) may comprise an epoxy resin.

When forming such a lighting device, use of the coating disclosed herein allows hydrolysis sensitive phosphors to be used as the luminescent material in the wavelength converter. In particular, luminescent material that would likely degrade under the conditions used to form the matrix in which the luminescent particles are embedded to form the wavelength converter may be used in lighting devices (as shown in FIG. 3 below). For example, alkaline earth aluminate luminescent materials, or luminescent materials that have alkaline earth aluminate type surface layers after the washing process disclosed herein. Such hydrolysis sensitive luminescent materials include, for example, luminescent particles disclosed above that include a luminescent material selected from (the) $SrLiAl_3N_4:Eu^{2+}$ (class), in which, optionally also part of Sr may be replaced by another alkaline earth metal (group 2 elements of the periodic table). And also, for example, luminescent material (or phosphor) selected from a group consisting of $(Sr,Ca)LiAl_3N_4:Eu$, $(Sr,Ca,Ba)Li_dMg_aAl_bN_4:Eu$, with $0 \leq a \leq 4$; $0 \leq b \leq 4$; $0 \leq d \leq 4$; and $a+b+d=4$ and $2a+3b+d=10$, and $(Sr,Ba)Li_2Al_{2-z}Si_zO_{2-z}N_{2+z}:Eu$, wherein $0 \leq z \leq 0.1$ disclosed above. And also, for example $SrLi_2Al_{2-x}SiO_{2-x}N_{2+x}:Eu$ or $(Sr,Ca)SiAlN_3:Eu$ disclosed above. Use of the coating disclosed herein allows such hydrolysis sensitive luminescent materials to be used in processes for forming wavelength converters, for example, processes for forming wavelength converters in which luminescent particles are embedded within a matrix, such as silicone resins, which otherwise may degrade the uncoated luminescent materials.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention also provides an LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Especially, the light source is a light source that during operation emits (light source radiation) at least light at a wavelength in the range of 200-490 nm, especially a light source that during operation emits at least light at wavelength in the range of 400-490 nm, even more especially in the range of 440-490 nm. This light may partially be used by the wavelength converter nanoparticles (see further also below). Hence, in a specific embodiment, the light source is configured to generate blue light. In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs. The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL. In an embodiment, the light source may also provide light source radiation having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source radiation with a correlated color temperature in the range of 5000-20000 K, even more especially from the range of 6000-20000 K, such as 8000-20000 K. An advantage of the relative high color temperature may be that there may be a relatively high blue component in the light source radiation.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7a shows a schematic top view of an electronics board on which an array of pcLEDs may be mounted, and FIG. 7b similarly shows an array of pcLEDs mounted on the electronic board of FIG. 7a.

The schematic drawings are not necessarily to scale.

DETAILED DESCRIPTION OF THE EMBODIMENTS

Figure 1:
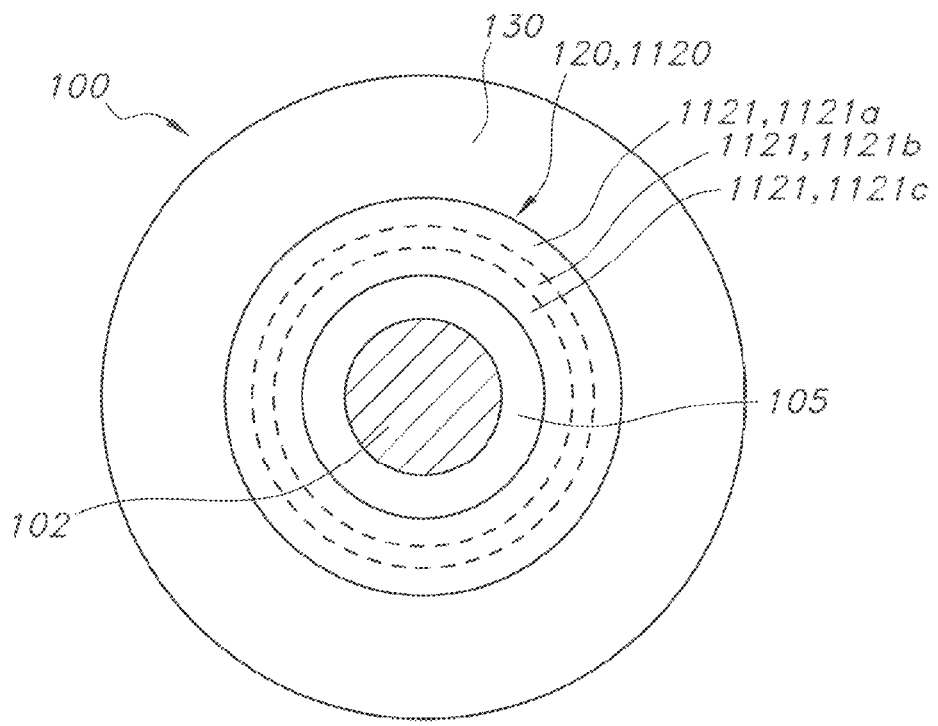
FIG. 1 schematically depicts aspects of a luminescent particle.

FIG. 1 schematically depicts an embodiment of the luminescent particles 100. The luminescent particle 100 comprises a luminescent core 102 comprising a primer layer 105 on the luminescent core 102. Herein the luminescent core 102 with the primer layer 105 is also referred to as a primer layer 105 comprising luminescent particle 100. The primer layer 105 has a chemical composition differing from the chemical composition of the core 102. The luminescent core 102 may include e.g. micrometer dimensional particles of a luminescent nitride or sulfide phosphor but may also include other (smaller) material such as luminescent nanoparticles (see further FIG. 2b).

The luminescent particle 100 further comprises a main ALD coating layer 120. In the depicted embodiment the main ALD coating layer 120 comprises a multilayer 1120 with three layers 1121, layer 1121a, layer 1121b, and layer 1121c. The three layers 1121a, 1121b, 1121c especially have (at least two) different chemical compositions. Especially adjacently (and contacting) arranged layers 1121 have different compositions. Moreover, one or more of the layers 1121 of the multilayer 1120 may have chemical compositions (also) differing from the chemical composition of the primer layer 105. The layers 1121 may in embodiments e.g. comprise different oxides of Al, Zn, Hf, Ta, Zr, Ti, Sn, Nb, Y, Ga, and V. Additionally or alternatively, the layers 1121 may comprise Si and/or Ge. Especially one of the layers 1121 may be an alumina layer.

The luminescent particle 100 further comprises a main sol-gel coating layer 130, especially having a chemical composition differing from one or more of the layers 1121 of the multilayer 1120. The figure further shows that main ALD coating layer 120 is arranged between the primer layer 105 and the main sol-gel layer 130. Especially, adjacently arranged/contacting coating layers may have different compositions. In the depicted figure, layer 1121a especially has a composition that differs from the composition of the main sol-gel layer 130. Layer 1121c especially has a composition that differs from the composition of the primer layer 105. The hybrid coating of the embodiment in FIG. 1 thus comprises a primer layer 105, a main ALD layer 120 and a main sol-gel coating layer 130. In further embodiments, see e.g. FIG. 2a, the hybrid coating further comprises a further ALD coating layer 140.

Figure 2A:
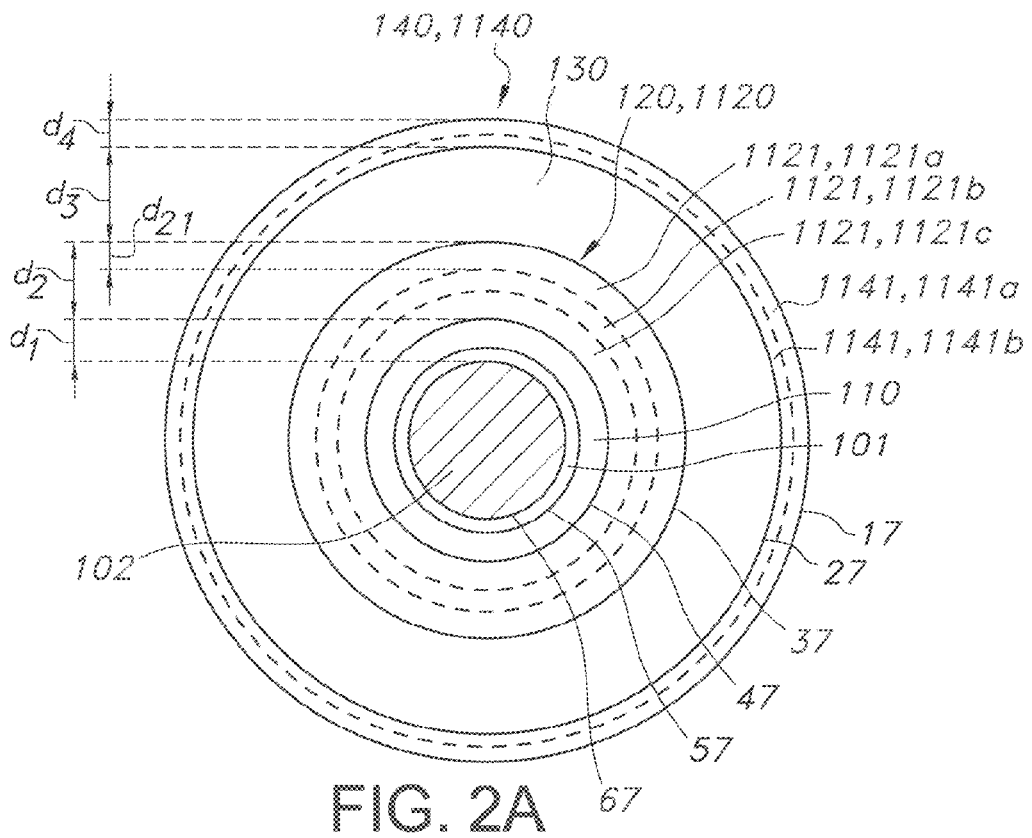
FIG. 2a-2b schematically depict some further aspects of a luminescent particle.

The embodiment of FIG. 2a also comprises a further ALD coating layer 140 arranged on the main sol-gel coating layer 130. In the depicted embodiment, the further ALD coating layer 140 (also) comprises a further multilayer 1140 comprising two (further sub) layers 1141, 1141a, 1141b (of the further multilayer 1140). Yet, in other embodiments the further ALD coating layer 140 is (deposited as) a single layer. In FIG. 2a also the thicknesses of the layers are indicated. It is noted that the thicknesses are not to scale and only are depicted to explain the meaning of the terms and show the location. The primer layer thickness is indicated by the reference d1. The primer layer thickness d1 may be in the range of 0.1-5 nm. The ALD coating layer thickness is indicated with the reference d2. The ALD coating layer thickness d2 may especially be in the range of 5-250 nm. The thickness of the main sol-gel coating 130 is indicated with reference d3. The main sol-gel coating layer thickness d3 is generally larger than the ALD coating layer thickness d2. The main sol-gel coating layer thickness d3 is especially in the range of 50-700 nm. The depicted embodiment comprises a multilayer 1120 with three layers 1121, each layer 1121 having a layer coating layer thickness d21 in the range of 1-20 nm. In the depicted embodiment, the layer coating thickness d21 of the three layers 1121 is about the same. The layer coating thickness d21 may though vary between the different layers 1121, see e.g. FIG. 4b. The three layers 1121a, 1121b and 1121c may e.g. depict alternating $Al_2O_3$ layers (by way of example 1121b) and $Ta_2O_5$ layers (by way of example 1121a,1121c). The (further sub) layer coating layer thickness (not indicated with a reference) of the (further sub) layers 1141 of the further multilayer 1140 may especially be in the ranges as described in relation to the layer coating layer thickness d21 of the layers 1121 of the multilayer 1120.

FIG. 2a further schematically depicts that the primer layer 105 comprises an oxide-containing layer 101 and a primary sol-gel layer 110. The oxide-containing layer 101 is arranged at a surface 67 of the core 102. In the embodiment, the oxide-containing layer 101 and the primary sol-gel layer 110 are continuous and conformal. Yet, in further embodiments, this may not be the case, and e.g. the main ALD coating layer 120 may contact the oxide-containing layer 101 at some locations and may even contact the surface 67 of the core at some further location (while contacting the primary sol-gel layer 110 at other locations.

FIG. 2a further indicates with references 17, 27, 37, 47, 57 the surfaces of respective layers, and with reference 67 the surface of the core 102. As indicated above, the layer thicknesses described herein are especially average layer thicknesses. Especially at least 50%, even more especially at least 80%, of the area of the respective layers have such indicated layer thickness. Hence, referring to the thickness d2 between surface 47 and surface 37, below at least 50% of surface 37, a layer thickness in the range of e.g. 5-250 nm may be found, with the other less than at least 50% of the surface area 37 e.g. smaller or larger thicknesses may be found, but in average d2 of the main ALD coating (multi-) layer 120 is in the indicated range of 5-250 nm. Likewise, this may apply to the other herein indicated thicknesses. For instance, referring to the thickness d3 between surface 37 and surface 27, this thickness may over at least 50% of the area of 27 be in the range of 50-700 nm, with the other less than at least 50% of the surface area 27 e.g. smaller or larger thicknesses may be found, but in average d1 of the first layer main sol-gel layer 130 is in the indicated range of 50-700 nm, such as especially 100-500 nm.

Figure 2B:
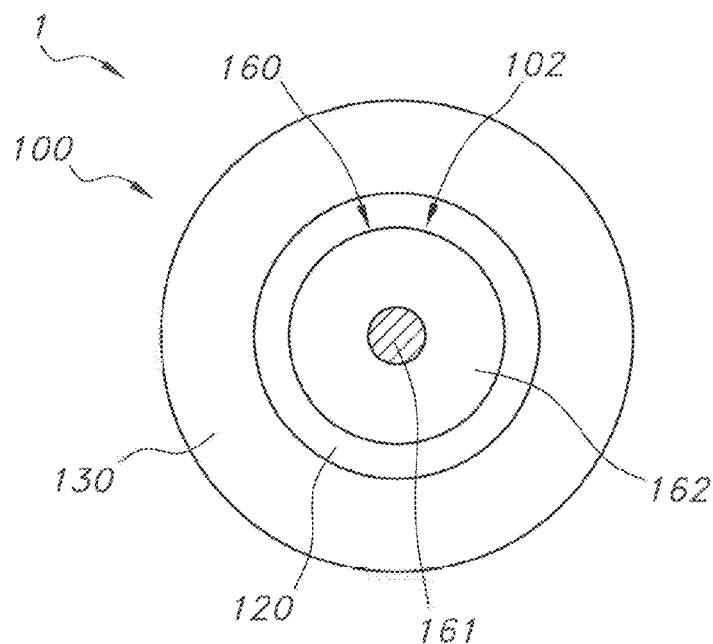

FIG. 2b schematically depicts an embodiment wherein the luminescent core 102 includes a luminescent nanoparticle, here by way of example a quantum dot 160. The quantum dot in this example comprises a quantum rod with a (semi-conductor) core material 161, such as ZnSe, and a shell 162, such as ZnS. Of course, other luminescent nanoparticles may also be used. Such luminescent quantum dot 160 can also be provided with the hybrid coating.

FIGS. 1-2 schematically depict luminescent particles 100 having a single nucleus. However, optionally also aggregates encapsulated with the hybrid coating may be formed. This may especially apply for quantum dots as luminescent particles defining the luminescent core 102.

The figures especially depict embodiments of the coating architecture on phosphor particles or luminescent cores 102 (after applying the respective (ALD and sol-gel) coating processes). The phosphor particles 102 may be covered by an oxide layer 101 formed by a washing and baking process. The primary sol-gel coating 110 comprises in embodiments silicon oxide ($SiO_2$) provided by a (primary) sol-gel coating process. The first $SiO_2$ layer 110 especially acts as nucleation or seed layer for the main ALD coating layer 120, provided by a main atomic layer deposition process. Therefore, (the primary layer 105 as well as) the primary sol-gel coating layer 110 does not need to form a conformal or fully closed coating around each core 102. The primary sol-gel coating 110, e.g. the primary $SiO_2$ layer 110 can also be seen as a surface treatment to provide OH-groups on the phosphor particles 102. Such OH-groups may assist the ALD precursors to bond on the surface and consequently initiate film growth.

The main ALD coating layer 120 especially comprises a multilayer 1120 also called "nanolaminate" 1120 of metal oxides (sub-)layers 1121. A nanolaminate 1120 may form an extremely dense and nearly pinhole free conformal coating on phosphor particles that is almost impermeable to gases like water vapor and oxygen. The nanolaminate protection layer 1120 may in embodiments have a thickness d2 of 20-50 nm consisting of more than two sub-layers of $Al_2O_3$, $TiO_2$, $ZrO_2$, $HfO_2$, $SnO_2$, ZnO or $Ta_2O_5$. Each layer 1121 may have a thickness d21 in the range of 1 nm-15 nm. The outer layer 1121, i.e. the layer (1121a in FIGS. 1 and 2a) contacting the main sol gel coating layer 130 is in embodiments a chemical stable layer such as $HfO_2$, $ZrO_2$ or $Ta_2O_5$ that does not corrode when exposed to water or other solvents such as cyclohexanone.

The main sol-gel coating layer 130 may also comprise silicon oxide ($SiO_2$) provided by the (main) sol-gel coating process, analog to the primary sol-gel coating layer 110. The main sol-gel coating 130 may especially function as mechanical protection to prevent damage of the underlying barrier coating 120. In an LED fabrication process phosphor particles undergo various process steps, such as mixing, sieving, pressing, and molding. These process steps may induce mechanical stress in the coating. As a results the coating might be damaged. The main sol-gel coating layer 130 provides a high robustness against post-processing and fabrication steps. In embodiments a high reliability can be guaranteed by applying the main sol-gel coating layer 130 layer on the luminescent particles 100.

In embodiments of the invention, a further ALD coating layer 140 is added to the layer architecture, as depicted in FIG. 2a. The further ALD coating layer 140 in the embodiment comprises a nanolaminate 1140. The layer 140 or multilayer 1140 may comprise metal oxides such as $Al_2O_3$, $TiO_2$, $ZrO_2$, $HfO_2$, $SnO_2$, $ZnO$ or $Ta_2O_5$. The total thickness d4 of the layer 140 is especially in the range of 10-50 nm. The further ALD coating layer 140 may further stabilize the overall coating structure by filling pores and pin-holes in the main sol-gel coating layer 130. In addition, the further ALD coating layer 140 can suppress the surface reactivity of the main sol-gel layer 130. This surface reactivity may be in embodiments of LED manufacturing processes be advantageous for maintaining the rheology or other properties of certain silicone phosphor slurries.

Figure 3:
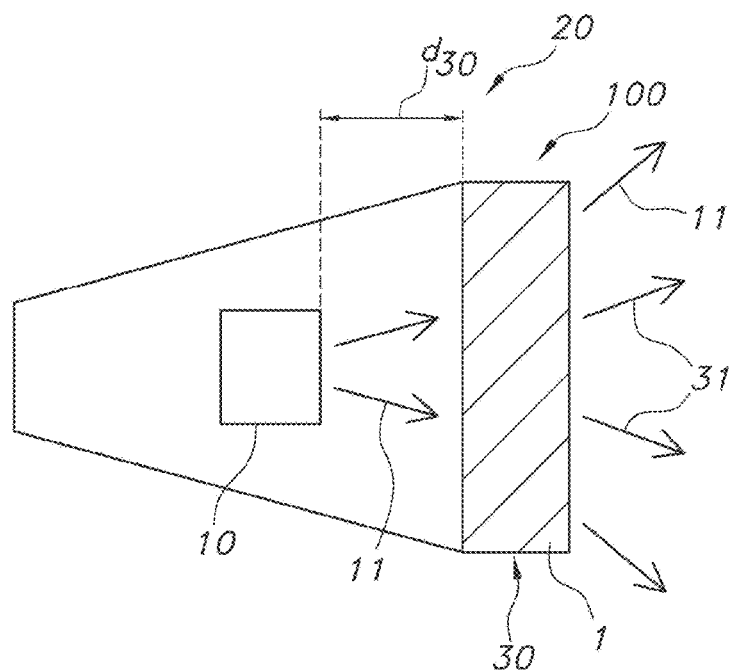
FIG. 3 schematically depicts a lighting device.

FIG. 3 schematically depicts a lighting device 20 comprising a light source 10 configured to generate light source radiation 11, especially one or more of blue and UV, as well as a wavelength converter 30 comprising the luminescent material 1 with particles 100 as defined herein. The wavelength converter 30 may e.g. comprise a matrix, such as a silicone or organic polymer matrix as described above, with the coated particles 100 embedded therein. The wavelength converter 30 is configured to (wavelength) convert at least part of the light source radiation 11 into wavelength converter light 31. Optionally also light source radiation 11 may pass the wavelength converter 30 (without being converted). The wavelength converter light 31 at least includes luminescence from the herein described coated particles 100. However, the wavelength converter 30 may optionally include also one or more other luminescent materials. The wavelength converter 30, or more especially the luminescent material 1, may be arranged at a non-zero distance d30, such as at a distance of 0.1-100 mm. However, optionally the distance d30 may be zero, such as e.g. when the luminescent material is embedded in a dome on a LED die. The distance d30 is the shortest distance between a light emitting surface of the light source 10, such as a LED die, and the wavelength converter 30, more especially the luminescent material 1.

The light source 10 may be an LED, such that lighting device 20 is a phosphor-converter LED ("pcLED"). For example, light source 10 may be a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Figure 4A:
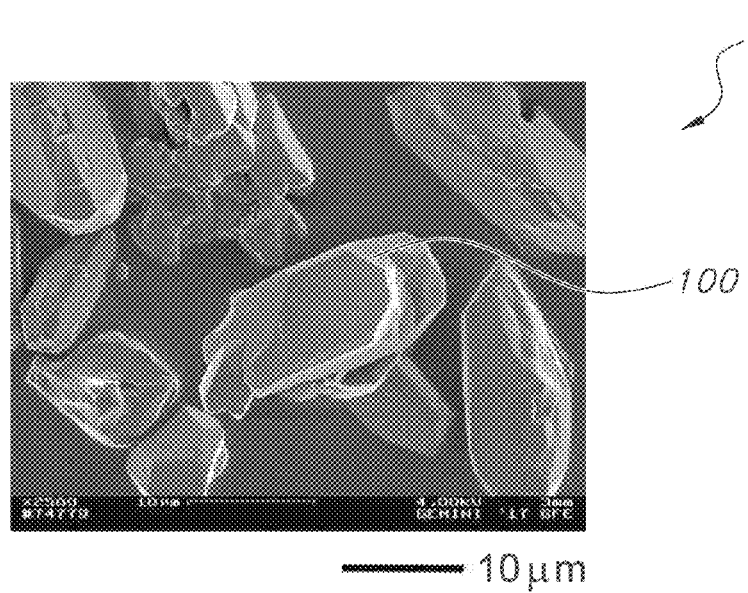
FIG. 4a-4b show a SEM and a TEM image of a luminescent particle.
Figure 4B:
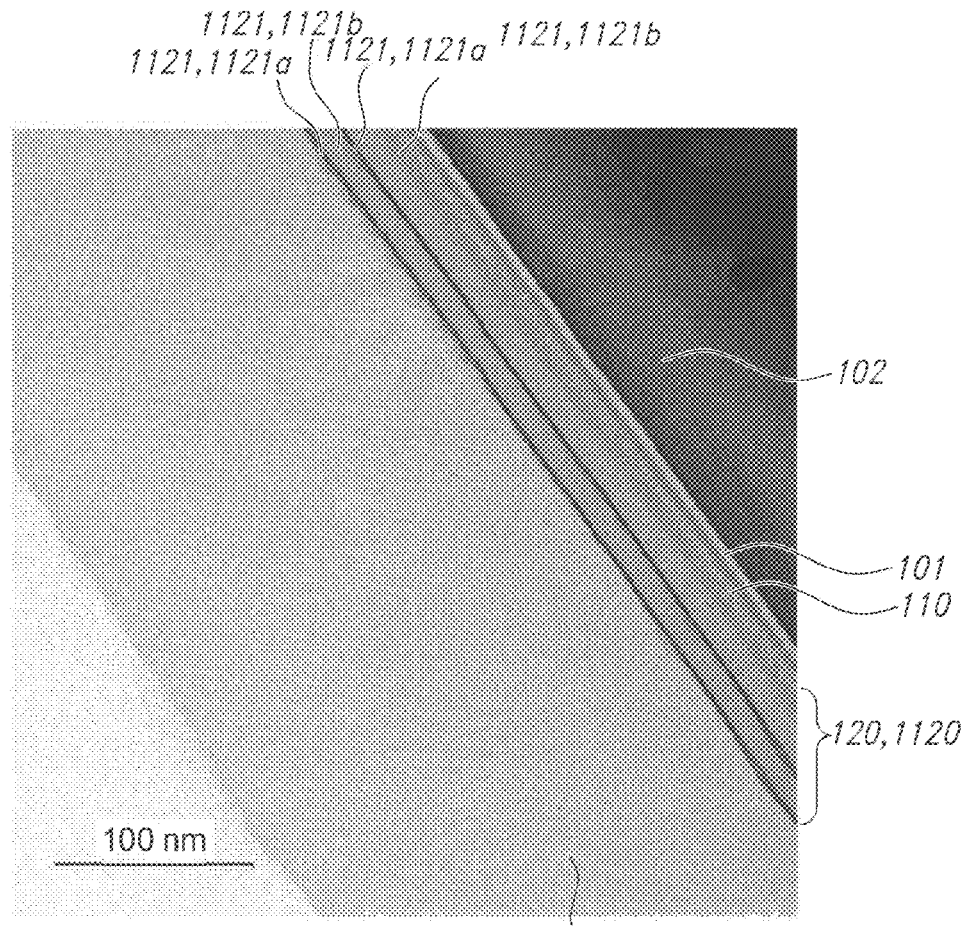

FIG. 4a shows a SEM image of luminescent material 1 comprising some coated luminescent particles 100. In FIG. 4b a TEM image of a coated luminescent particle 100 is given, clearly showing or core 102 with an oxide-containing layer 101, a primary ($SiO_2$) sol-gel coating layer 110, a main ALD coating layer 120, comprising a multilayer 1120 consisting of two $Al_2O_3$ layers 1121b, and two $Ta_2O_5$ layers 1121a, and a ($SiO_2$) main sol-gel coating 130.

Figure 5A:
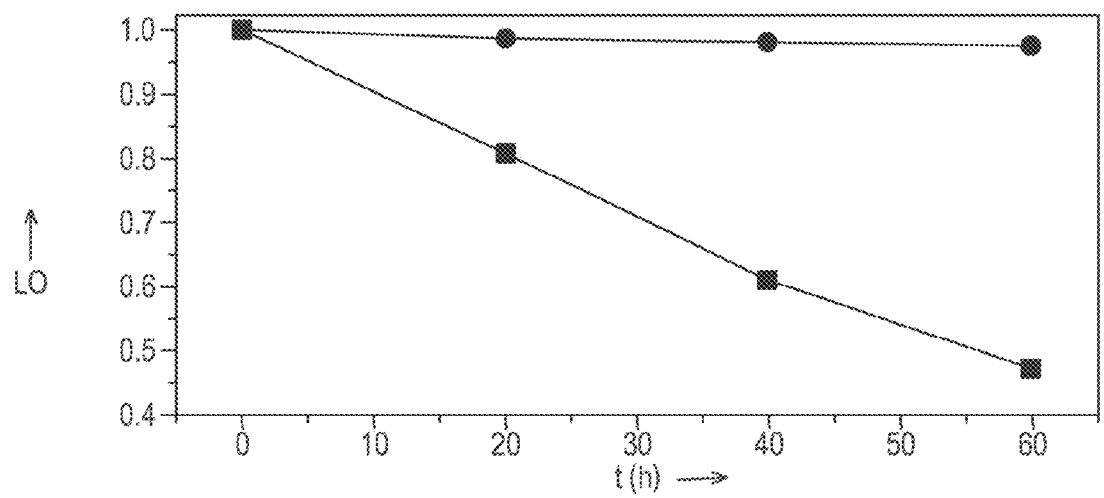
FIGS. 5a-5b show some experimental results wherein embodiments of the invention are compared to prior art luminescent materials.
Figure 5B:
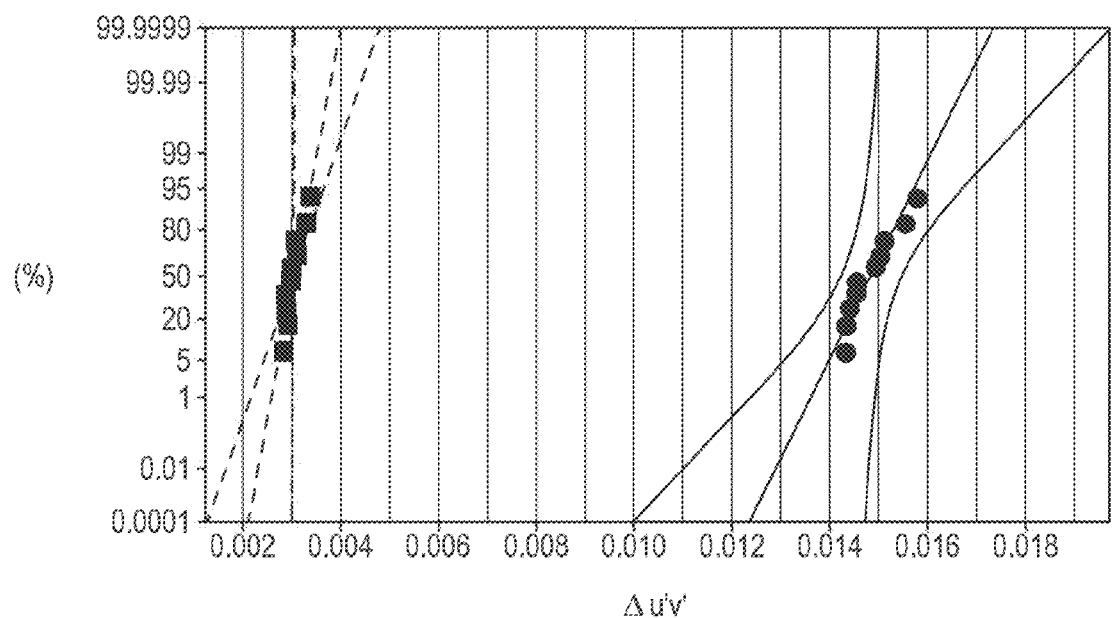

FIGS. 5a-5b show some experimental results. In the figures, coated luminescent particles 100 of the invention (here comprising $SrLiAl_3N_4:Eu$) are compared to corresponding prior art luminescent particles. The prior art luminescent particles also comprise an ALD coating layer and a sol-gel coating layer. However, the sol-gel coating layer is configured directly at the surface of the luminescent core 102, and the ALD coating layer is configured onto the sol-gel coating.

In FIG. 5a. the (normalized) light output (Y-axis) over time, especially hours (X-axis) of the respective luminescent particles in silicone is given. During the experiment, the particles were kept at 130° C. and 100% relative humidity. The circular markers indicate the luminescent particle 100 of the invention; the square markers indicate the prior art luminescent particle.

In FIG. 5b. the failure probability of white LEDs with the respective luminescent particles is given after maintaining the respective LEDs over 500 hours at 85° C. and 85% relative humidity. The square markers indicate the luminescent particle 100 of the invention; the circular markers indicate the prior art luminescent particle. Note that the probability is given in percentages at the Y-axis in a logarithmical scale. The color point shift in $\Delta u'v'$ (sometimes also indicated as "(du'v')" or "duv") is given at the X-axis. The (LEDs comprising the) luminescent particles 100 of the invention clearly show less color shift ($\Delta u'v'$ is calculated as the Euclidian distance between a pair of chromaticity coordinates in the (u', v') CIE 1976 color space).

Hence, this invention concerns methods to improve the barrier properties of phosphor particle coatings. While the invention is generally applicable to various phosphor particles, it is particularly suitable for nitride based narrowband, red-emitting phosphors like nitride aluminates or oxo nitride aluminates due to their high sensitivity against moisture.

Figure 6A:
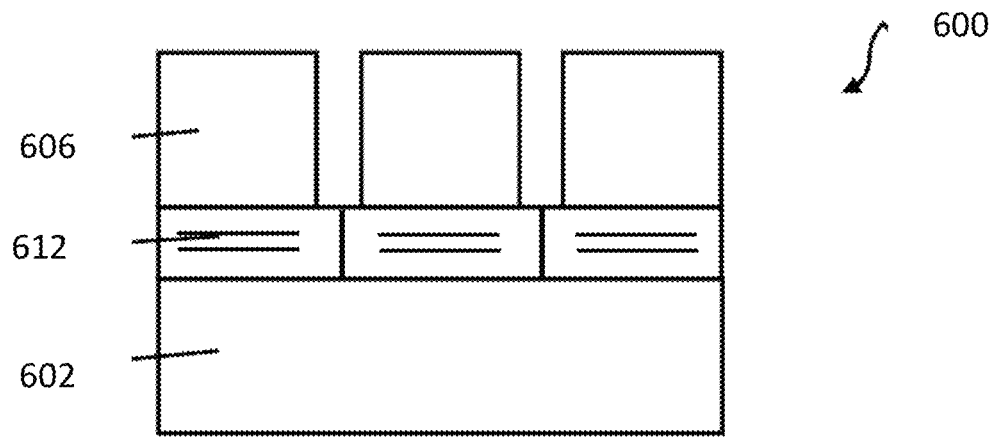
FIGS. 6a-6b show, respectively, cross-sectional and top schematic views of an array of pcLEDs.
Figure 6B:
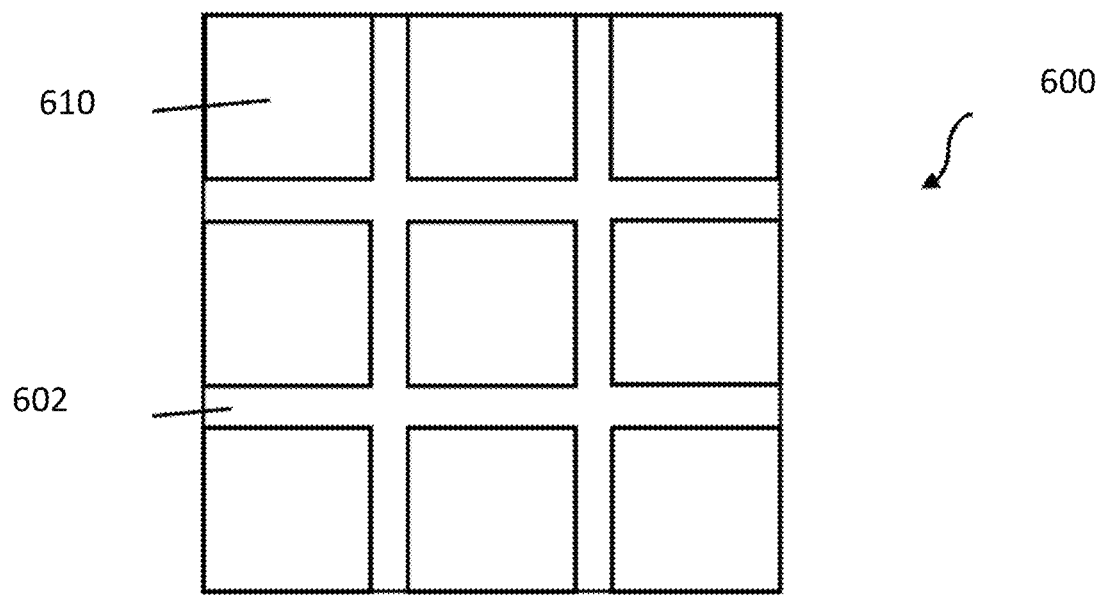

FIGS. 6A-6B show, respectively, cross-sectional and top views of an array 600 of pcLEDs 610, which pcLEDs 610 may be structured as lighting device 20, as shown in FIG. 3, that include a wavelength converter 30 comprising the coated luminescent particles 100 as defined herein included in phosphor pixels 606 with semiconductor diode 612 disposed on a substrate 602. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 602 may optionally comprise CMOS circuitry for driving the LED and may be formed from any suitable materials.

Although FIGS. 6A-6B, show a three-by-three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape or arrangement.

LEDs having dimensions in the plane of the array (e.g., side lengths) of less than or equal to about 50 microns are typically referred to as microLEDs, and an array of such microLEDs may be referred to as a microLED array.

An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels.

Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 7A:
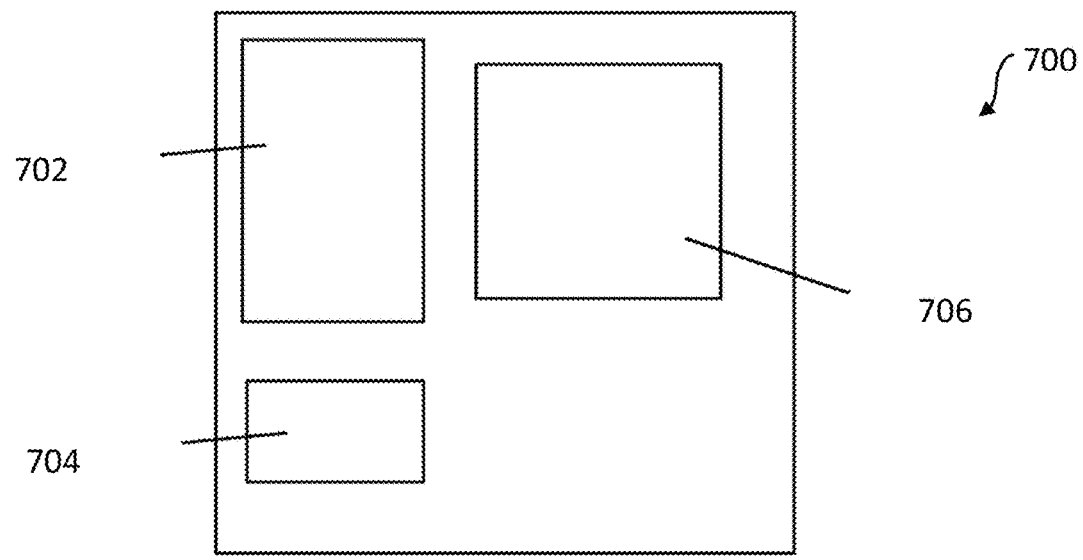
Figure 7B:
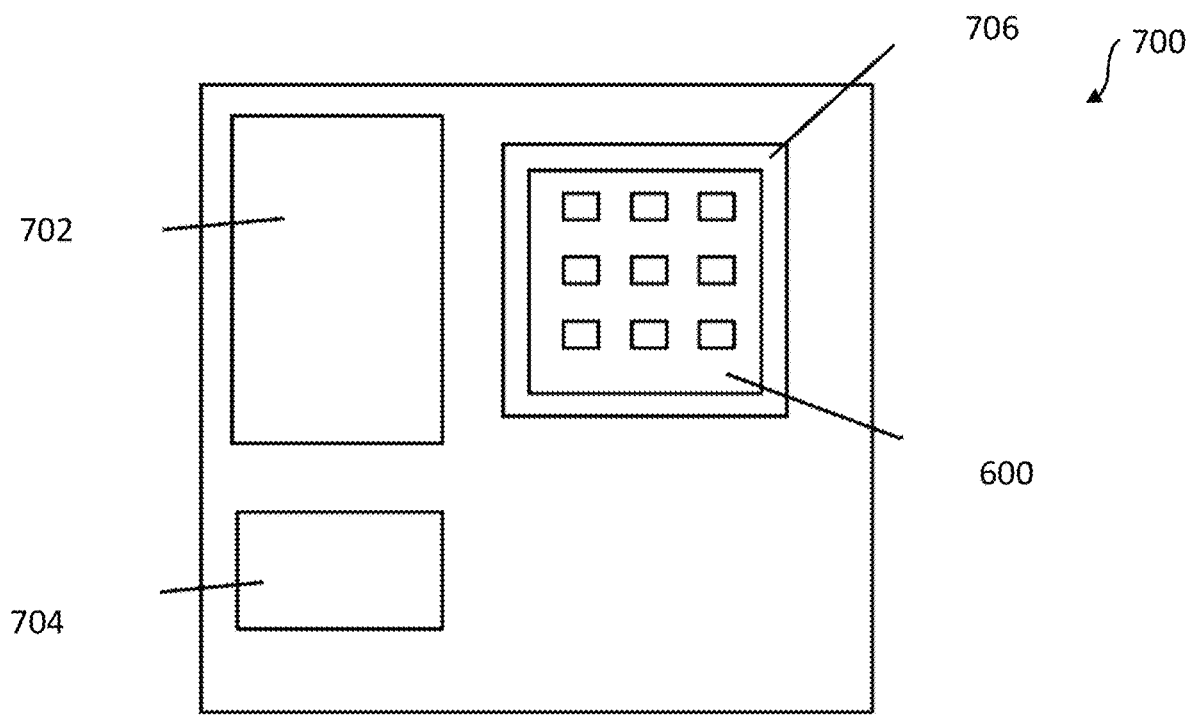

As shown in FIGS. 7A-7B, a pcLED array 600 may be mounted on an electronics board 700 comprising a power and control module 702, a sensor module 704, and an LED attach region 706. Power and control module 702 may receive power and control signals from external sources and signals from sensor module 704, based on which power and control module 702 controls operation of the LEDs. Sensor module 704 may receive signals from any suitable sensors, for example from temperature or light sensors. Alternatively, pcLED array 600 may be mounted on a separate board (not shown) from the power and control module and the sensor module.

Figure 8A:
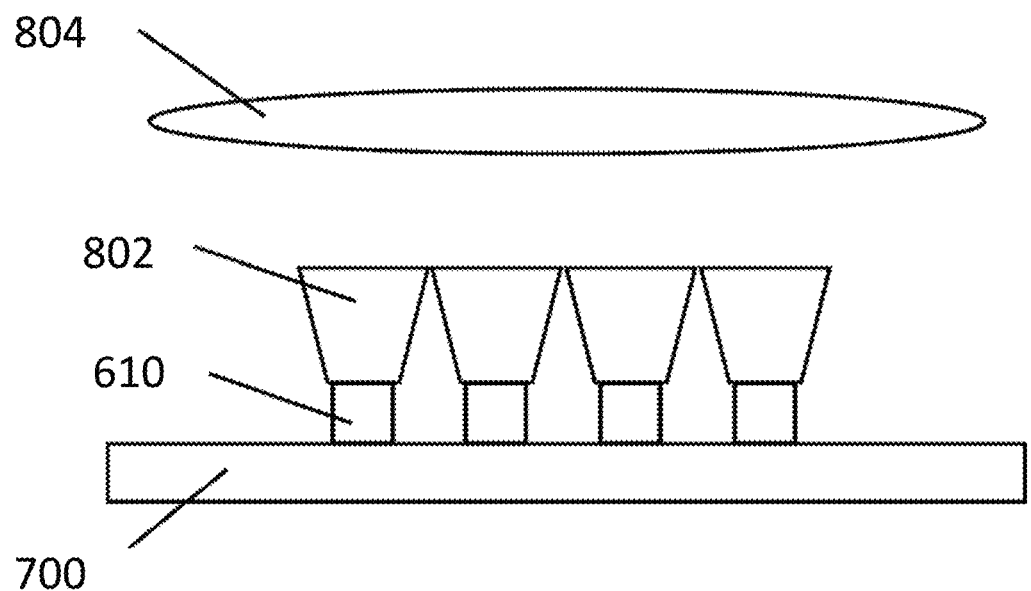
FIG. 8a shows a schematic cross-sectional view of an array of pcLEDs arranged with respect to waveguides and a projection lens.
Figure 8B:
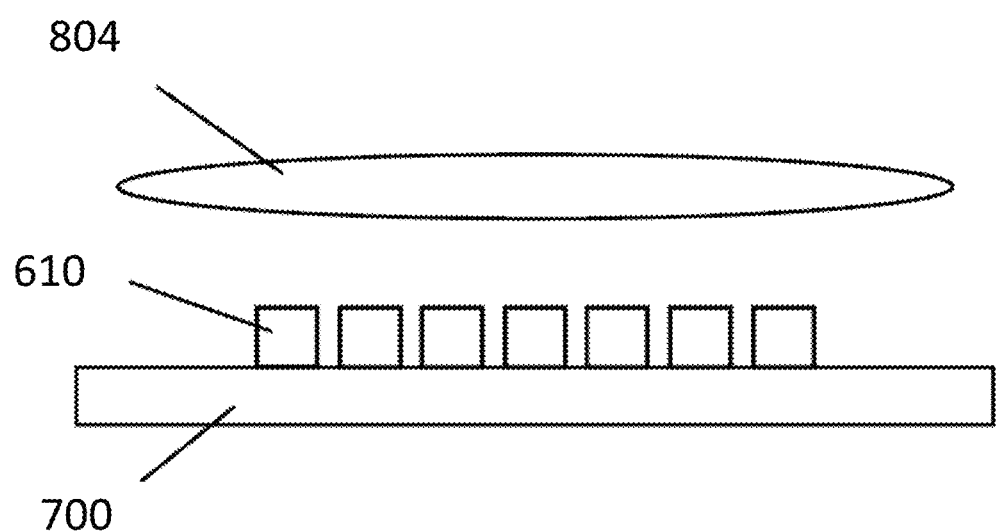
FIG. 8b shows an arrangement similar to that of FIG. 8a, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 8A-8B a pcLED array 600 (for example, mounted on an electronics board 700) may be arranged in combination with secondary optical elements such as waveguides, lenses, or both for use in an intended application. In FIG. 8A, light emitted by pcLEDs 610 is collected by waveguides 802 and directed to projection lens 804. Projection lens 804 may be a Fresnel lens, for example. This arrangement may be suitable for use, for example, in automobile headlights. In FIG. 8B, light emitted by pcLEDs 610 is collected directly by projection lens 804 without use of intervening waveguides. This arrangement may be particularly suitable when pcLEDs can be spaced sufficiently close to each other and may also be used in automobile headlights as well as in camera flash applications. A microLED display application may use similar optical arrangements to those depicted in FIGS. 8A-8B, for example. Generally, any suitable arrangement of optical elements may be used in combination with the LED arrays described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive, mobile device camera, VR, and AR applications.

Figure 9:
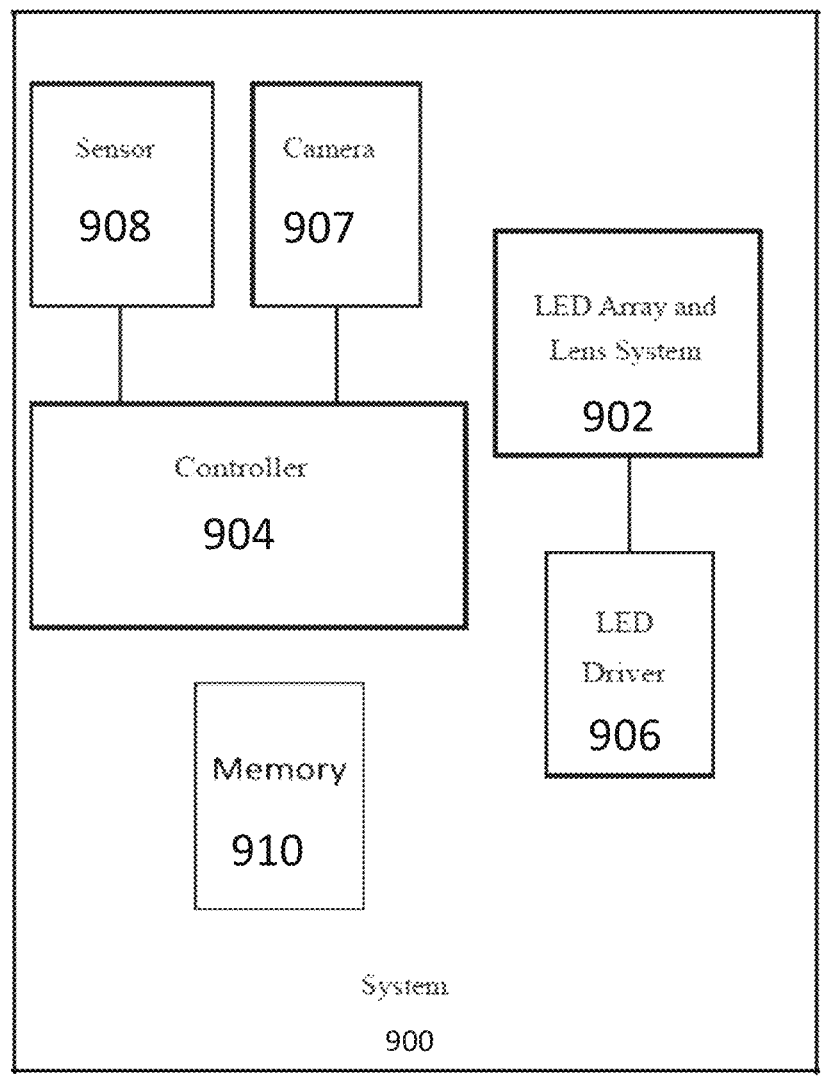
FIG. 9 schematically illustrates an example camera flash system comprising an adaptive illumination system.

FIG. 9 schematically illustrates an example camera flash system 900 comprising an LED array and lens system 902, which may be similar or identical to the systems described above. Flash system 900 also comprises an LED driver 906 that is controlled by a controller 904, such as a microprocessor. Controller 904 may also be coupled to a camera 907 and to sensors 908, and operate in accordance with instructions and profiles stored in memory 910. Camera 907 and adaptive illumination system 902 may be controlled by controller 904 to match their fields of view.

Sensors 908 may include, for example, positional sensors (e.g., a gyroscope and/or accelerometer) and/or other sensors that may be used to determine the position, speed, and orientation of system 900. The signals from the sensors 908 may be supplied to the controller 904 to be used to determine the appropriate course of action of the controller 904 (e.g., which LEDs are currently illuminating a target and which LEDs will be illuminating the target a predetermined amount of time later).

In operation, illumination from some or all pixels of the LED array in 902 may be adjusted—deactivated, operated at full intensity, or operated at an intermediate intensity. Beam focus or steering of light emitted by the LED array in 902 can be performed electronically by activating one or more subsets of the pixels, to permit dynamic adjustment of the beam shape without moving optics or changing the focus of the lens in the lighting apparatus.

Figure 10:
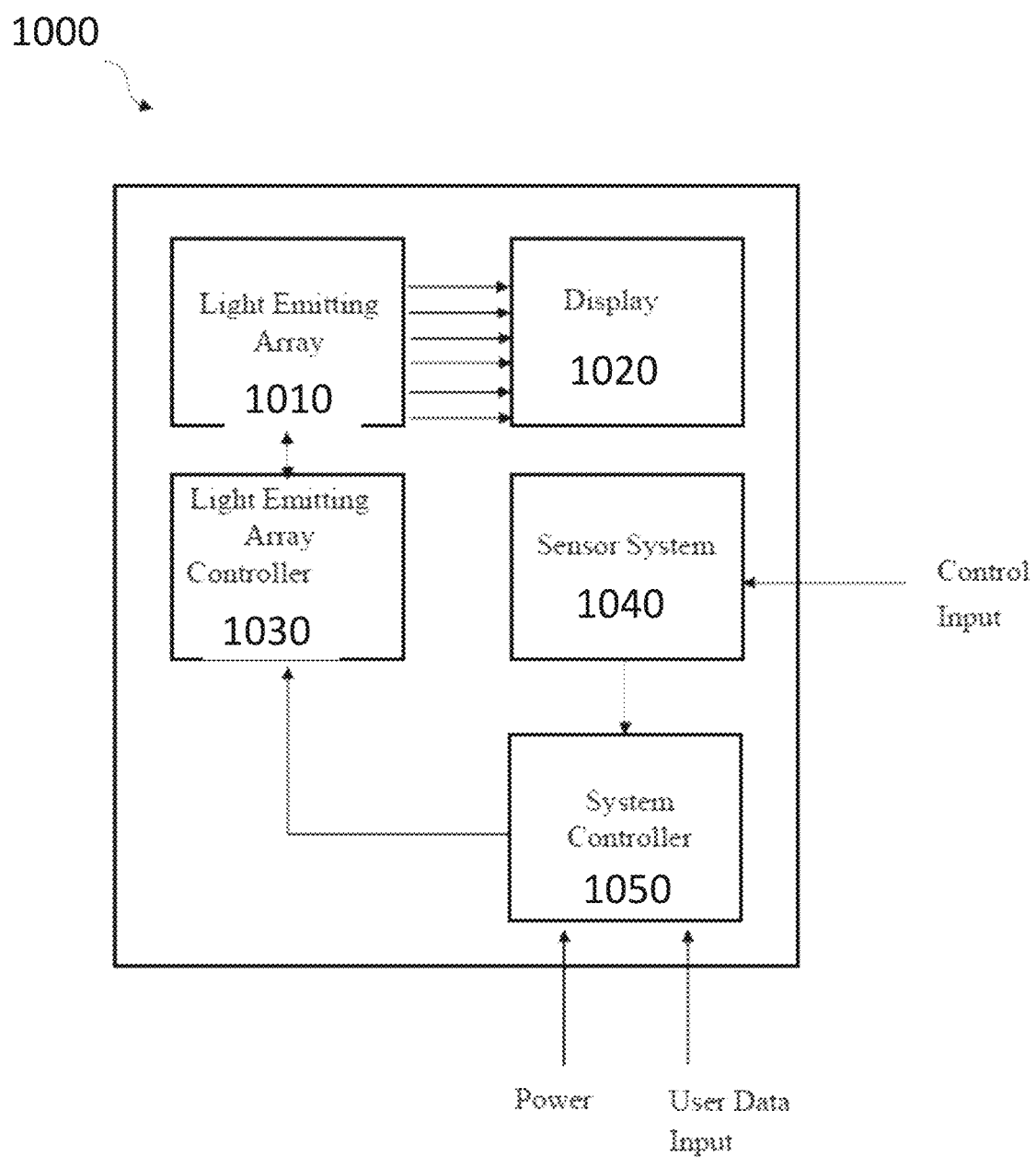
FIG. 10 schematically illustrates an example display (e.g., AR/VR/MR) system that includes an adaptive illumination system.

FIG. 10 schematically illustrates an example display (e.g., AR/VR/MR) system 1000 that includes an adaptive light emitting array 1010, display 1020, a light emitting array controller 1030, sensor system 1040, and system controller 1050. Control input is provided to the sensor system 1040, while power and user data input is provided to the system controller 1050. In some embodiments modules included in system 1000 can be compactly arranged in a single structure, or one or more elements can be separately mounted and connected via wireless or wired communication. For example, the light emitting array 1010, display 1020, and sensor system 1040 can be mounted on a headset or glasses, with the light emitting controller and/or system controller 1050 separately mounted.

The light emitting array 1010 may include one or more adaptive light emitting arrays, as described above, for example, that can be used to project light in graphical or object patterns that can support AR/VR/MR systems. In some embodiments, arrays of microLEDs can be used.

System 1000 can incorporate a wide range of optics in adaptive light emitting array 1010 and/or display 1020, for example to couple light emitted by adaptive light emitting array 1010 into display 1020.

Sensor system 1040 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 1040, system controller 1050 can send images or instructions to the light emitting array controller 1030. Changes or modification to the images or instructions can also be made by user data input, or automated data input as needed. User data input can include but is not limited to that provided by audio instructions, haptic feedback, eye or pupil positioning, or connected keyboard, mouse, or game controller.

In an embodiment, the invention provides a wet chemical washing (including drying) process of the powder phosphor (the luminescent core(s)) to form an oxide outer particle layer. Further a primary ($SiO_2$) sol-gel layer may be deposited by a (primary) sol-gel process to provide the primary sol-gel layer with a thickness in the range of 0.5-5 nm. Next, a multilayer may be deposited by ALD with a total ALD coating layer thickness d2 in embodiments of 20-50 nm and a (sub)layer thickness d21 of the layers 1121 of the multilayer 1120 in the range of 1-20 nm. The multilayer 1120 is especially comprised of two or more metal oxides such as $Al_2O_3$, $TiO_2$, $ZrO_2$, $HfO_2$, $SnO_2$, $ZnO$, $Ta_2O_5$. Next, a third layer, especially a main sol-gel coating layer 130, e.g. of $SiO_2$ may be deposited by a (main) sol-gel process with a thickness in the range of 100-500 nm. In yet further embodiments, a fourth layer 140 may be deposited by a further ALD process. The further ALD coating layer 140 may in embodiments have a total thickness d4 of 5-50 nm and especially may comprise a multilayer with sub-layer thickness in the range of 1-20 nm. The multilayer is in embodiments comprised of one or more metal oxides, such as $Al_2O_3$, $TiO_2$, $ZrO_2$, $HfO_2$, $SnO_2$, $ZnO$, $Ta_2O_5$.

EXPERIMENTAL

The effect of the new coating architecture of the invention was tested by forming a luminescent particle with a hybrid coating as disclosed herein:
Polyol Washing Process:
10.3 g of a Raw Phosphor Powder Sample of Composition $Sr_{0.995}Li_2Al_{1.995}Si_{0.005}O_{1.995}N_{2.005}:Eu_{0.005}$ was mixed 30.0 g ethanol and 30.0 g triethylene glycol with the suspension showing a total water content in the 0.05-0.1% range in an ultrasonic bath followed by a 16 hr treatment at 80° C. in a closed pressure vessel. After cooling down to room temperature, the phosphor powder was washed with ethanol and dried at 100° C. under ambient atmosphere.
Mixed Solvent Acetic Acid Washing Process:
200-250 g of $SrLiAl_3N_4:Eu_{0.007}$ were stirred in 837 g isopropanol. 560 g of 18.5 wt % acetic acid were slowly added under stirring. The suspension was further stirred until a total time of 40 min (including acid addition) passed. After 30 min sedimentation the supernatant was largely removed by decantation followed by filtration and rinsing with acetic acid/isopropanol mixture and isopropanol. The washed phosphor is finally dried at 50° C. in vacuum overnight.
Thin Amorphous Silica Layer (<5 nm)
In this experiment a primary sol-gel coating layer was provided. 200 g phosphor powder (typically after washing) were stirred in 960 g ethanol. To this suspension 3.5 g tetraethyl orthosilicate were added and stirred for 10 min under sonication. 90 g 25 wt % aqueous ammonia solution were added and stirring under sonication is continued for another 20 min. Fine particles including nanosized silica particles formed as by-product were removed by threefold sedimentation in ethanol and decantation. The coated powder was dried at 50° C. in vacuum overnight. After dry-sieving (mesh size 100 μm) the coating was cured by heating the powder to 300° C. for 10 hr. under vacuum.
ALD Nanolaminate (~25 nm)
Next, a main ALD coating layer comprising an ALD nanolaminate was applied on primer layer comprising phosphor particles (comprising $SrLiAl_3N_4:Eu$) in a Picosun Oy ALD R200 reactor. Precursor materials were trimethylaluminum and $H_2O$ to form an $Al_2O_3$ film and (tert-Butylimido) tris(ethylmethylamino) tantalum (V) and $H_2O$ to form a $Ta_2O_5$ film. The deposition temperature was set to 250° C. The purge time of nitrogen gas in between precursor pulses was 60 seconds. The nanolaminate consists of 2×$Al_2O_3$/$Ta_2O_5$ sublayers with a total thickness of around 25 nm.
Thick Amorphous Silica Layer (~170 nm)
In this experiment a main sol-gel coating layer was provided on the luminescent particle. 85 g powder (typically after ALD coating) were stirred in 672 g ethanol for 15 min under sonication. To this suspension 1) 116 g 25 wt % aqueous ammonia solution were added fast (<30 s) and 2) a solution of 68 g tetraethyl orthosilicate in 408 g ethanol is added drop-wise (~45 min). After the addition of alkoxide precursor was finished, the suspension was stirred for another 30 min without sonication.
Fine particles including sub-micron sized silica particles formed as by-product were removed by threefold sedimentation in ethanol and decantation. The coated powder was dried at 50° C. in vacuum overnight. After dry-sieving (mesh size 63 μm) the coating was cured by heating the powder to 300° C. for 10 hr. under vacuum.

A SEM image of some of the particles is given in FIG. 4a.
A TEM image of the particles is given in FIG. 4b.
Comparison Test
The prepared particles in silicone were subjected to a stress test and compared with a control particles i.e. particles comprising a prior art coating architecture. In the prior art coating architecture the luminescent particle is initially coated with a relatively thick sol-gel coating and successively with a thin ALD coating. In the stress test, the light output was measured over time while keeping the particles at a temperature of 130° C. and 100% relative humidity.

The prepared particles were further applied in a white LED and stressed over 500 hours at 85° C. and 85% relative humidity. The failure probability of the white LEDs with the luminescent particles according to the invention was compared to the failure probability of white LEDs comprising the prior art coating architecture subjected to the same stress test (the control LED).

The results are depicted in FIGS. 5a-5b showing a significantly improved reduction in light output after 60 hours stress test, i.e. less than 5% compared to a reduction of more than 50% for the control particles. Also the color shift (Δu'v') is substantially minimized compared to the control LED.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A method for providing a luminescent particle with a hybrid coating, the method comprising:
   providing a particulate luminescent material having a surface;
   forming a primer layer directly on at least a portion of the surface;
   performing a first atomic layer deposition process on the particulate luminescent material having the primer layer to deposit a first ALD layer, the first atomic layer deposition process using a metal oxide first precursor selected from a group of metal oxides comprising Al, Zn, Hf, Ta, Zr, Ti, Sn, Nb, Y, Ga, and V;
   performing a second atomic layer deposition process to deposit a second ALD layer onto the first ALD layer, the second atomic layer deposition process using a metal oxide second precursor different from the first precursor and selected from a group of metal oxides comprising Al, Zn, Hf, Ta, Zr, Ti, Sn, Nb, Y, Ga, and V; and
   performing a main sol-gel coating process to form a main sol-gel coating layer directly onto the second ALD layer, the main sol-gel coating layer having a chemical composition different from the first ALD layer and the second ALD layer.

2. The method according to claim 1, wherein forming the primer layer directly onto at least a portion of the surface of the particulate luminescent material comprises performing a primer sol-gel coating process on the particulate luminescent material, the primer sol-gel coating process using a metal alkoxide precursor.

3. The method according to claim 2, wherein the primer sol-gel coating process comprises:
   suspending the particulate luminescent material in an alcohol-aqueous ammonia solution mixture;
   adding the metal alkoxide precursor to the mixture;
   stirring the mixture containing the metal alkoxide until the primer layer is formed;
   washing the particulate luminescent material having the primer layer with alcohol; and
   drying the particulate luminescent material having the primer layer.

4. The method according to claim 1, further comprising washing the particulate luminescent material in a washing solvent before forming the primer layer, the washing solvent having a pH<7.

5. The method according to claim 4, wherein the washing solvent comprises a weak acid and equal to or less than 50% wt/wt water, and washing the particulate luminescent material further comprises:
   successively subjecting the particulate luminescent material to a drying treatment.

6. The method according to claim 1, wherein:
   the primer layer has a primer layer thickness (d1) in the range of 0.1-5 nm,
   the first ALD layer and second ALD layer form a main ALD coating layer, and the main ALD coating layer has a main ALD coating layer thickness (d2) in the range of 5-250 nm; and
   the main sol-gel coating layer has a main sol-gel coating layer thickness (d3) in the range of 50-700 nm.

7. The method according to claim 1, wherein the main sol-gel coating process comprises:
   providing a mixture of an alcohol, ammonia, water, the particulate luminescent material having the primer layer and the first ALD layer and the second ALD layer, and a metal alkoxide precursor while agitating the mixture, and allowing a main sol-gel coating layer to be formed directly onto the second ALD layer, the metal alkoxide precursor is titanium alkoxide, silicon alkoxide, and or aluminum alkoxide; and
   retrieving the particulate luminescent material having the primer layer, the first ALD layer and the second ALD layer and the main sol-gel coating layer from the mixture and subjecting the retrieved particulate luminescent material having the primer layer, the first ALD layer and the second ALD layer and the main sol-gel coating layer to a heat treatment.

8. The method according to claim 1, comprising:
   successively providing n additional ALD layers, wherein 2≤n≤10, between the first ALD layer and the second ALD layer, each additional ALD layer has an additional ALD layer coating layer thickness (d21) in the range of 1-20 nm, one or more additional ALD layers comprising either one or more metal oxides selected from a group of $HfO_2$, $ZrO_2$, $TiO_2$, and $Ta_2O_5$, or $Al_2O_3$, and wherein the second ALD layer consist of one or more metal oxides selected from the group of HfO2, $ZrO_2$, $TiO_2$, and $Ta_2O_5$.

9. The method according to claim 1, further comprising: providing a further ALD coating layer onto the main sol-gel coating by application of a further atomic layer deposition process, in the further atomic layer deposition process a further metal oxide precursor is selected from a group of metal oxides comprising Al, Zn, Hf, Ta, Zr, Ti, Sn, Nb, Y, Ga, and V, the further ALD coating layer has a further ALD coating layer thickness (d4) in the range of 10-50 nm, and the further ALD coating layer comprises two or more layers having different chemical compositions, one or more of the layers comprise metal oxides selected from a group of $Al_2O_3$, $TiO_2$, $ZrO_2$, $HfO_2$, $SnO_2$, ZnO and $Ta_2O_5$, and the two or more layers have a chemical composition differing from the chemical composition of the main sol-gel coating layer.

10. The method according to claim 1, wherein the surface of the particulate luminescent material comprises an alkaline earth element, aluminum, and oxide, wherein the alkaline earth element comprises strontium.

11. The method according to claim 1, wherein the particulate luminescent material is selected from a group consisting of (i) (i) the $SrLiAl_3N_4:Eu^{2+}$ class, and (ii) the $SrLi_2Al_{1.995}Si_{0.005}O_{1.995}N_{2.005}:Eu^{2+}$ class.

12. A luminescent material comprising:
a particulate luminescent material having a surface;
a primer layer disposed on and in contact with the surface of the particulate luminescent material, the primer layer comprising a primer layer metal oxide and having a thickness in the range of 0.1-5 nm;
a first ALD layer disposed on and in contact with the primer layer and any portion of the surface of the particulate luminescent material not covered with the primer layer, the first ALD layer comprising a first oxide of one or more of Al, Zn, Hf, Ta, Zr, Ti, Sn, Nb, Y, Ga, and V, and different from the primer layer metal oxide;
a second ALD layer disposed on and in contact with the first ALD layer, the second ALD layer comprising a second oxide of one or more of Al, Zn, Hf, Ta, Zr, Ti, Sn, Nb, Y, Ga, and V, and different from the first oxide, the first ALD layer and second ALD layer forming a main ALD layer having a thickness in the range of 5-250 nm; and
a main sol-gel coating layer disposed on the second ALD layer, wherein the main sol-gel coating has a main sol-gel coating layer thickness (d3) in the range of 50-700 nm, wherein the main sol-gel coating layer has a chemical composition differing from the first ALD layer and the second ALD layer.

13. The luminescent material according to claim 12, wherein at least a portion of the surface of the particulate luminescent material comprises an oxide.

14. The luminescent material according to claim 13, wherein at least a portion of the surface of the particulate luminescent material comprises an alkaline earth element and aluminum, wherein the alkaline earth element comprises strontium.

15. The luminescent material according to claim 12, wherein the particulate luminescent material is selected from a group consisting of (i) the $SrLiAl_3N_4:Eu^{2+}$ class, and (ii) the $SrLi_2Al_{1.995}Si_{0.005}O_{1.995}N_{2.005}:Eu^{2+}$ class.

16. The luminescent material according to claim 12, further comprising a further ALD coating layer arranged onto the main sol-gel coating layer, the further ALD coating layer having a further ALD coating layer thickness (d4) in the range of 10-50 nm, the further ALD coating layer comprises a further multilayer with two or more layers having different chemical compositions, one or more of the layers comprising metal oxides selected from a group of $Al_2O_3$, $TiO_2$, $ZrO_2$, $HfO_2$, $SnO_2$, ZnO and $Ta_2O_5$, and the two or more layers having a chemical composition differing from the chemical composition of the main sol-gel coating layer.

17. The luminescent material according to claim 12, further comprising n additional ALD layers, wherein $2 \leq n \leq 10$, between the first ALD layer and the second ALD layer, each additional ALD layer having an additional ALD layer coating layer thickness (d21) in the range of 1-20 nm, and one or more of the additional ALD layers comprise one or more metal oxides selected from a group of $HfO_2$, $ZrO_2$, $TiO_2$, and $Ta_2O_5$.

18. A display system comprising:
a light emitting diode array, the light emitting diode array including a plurality of phosphor converted light emitting diodes, each phosphor converted light emitting diode including a wavelength converter comprising the luminescent material of claim 12;
a display; and
a lens or lens system spaced apart from the light emitting diode array and arranged to couple light from the light emitting diode array into the display.

19. A mobile device comprising:
a camera; and
a flash illumination system comprising:
a light emitting diode array including a plurality of light emitting diodes, each light emitting diode including a wavelength converter comprising the luminescent material of claim 12.

* * * * *